(12) United States Patent
Rabkin et al.

(10) Patent No.: US 10,763,271 B2
(45) Date of Patent: Sep. 1, 2020

(54) THREE-DIMENSIONAL MEMORY DEVICE CONTAINING ALUMINUM-SILICON WORD LINES AND METHODS OF MANUFACTURING THE SAME

(71) Applicant: SANDISK TECHNOLOGIES LLC, Addison, TX (US)

(72) Inventors: Peter Rabkin, Cupertino, CA (US); Masaaki Higashitani, Cupertino, CA (US); Jayavel Pachamuthu, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/019,961

(22) Filed: Jun. 27, 2018

(65) Prior Publication Data
US 2020/0006364 A1 Jan. 2, 2020

(51) Int. Cl.
| | |
|---|---|
| H01L 27/11 | (2006.01) |
| H01L 27/11529 | (2017.01) |
| H01L 27/11556 | (2017.01) |
| H01L 27/11582 | (2017.01) |
| H01L 27/11573 | (2017.01) |
| H01L 27/1157 | (2017.01) |
| H01L 27/11519 | (2017.01) |

(Continued)

(52) U.S. Cl.
CPC .... *H01L 27/11529* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11573* (2013.01); *H01L 27/11582* (2013.01)

(58) Field of Classification Search
CPC ......... H01L 27/11519; H01L 27/11524; H01L 27/11556
See application file for complete search history.

(56) References Cited

U.S. PATENT DOCUMENTS

| | | | |
|---|---|---|---|
| 4,673,623 A | 6/1987 | Gardner et al. | |
| 5,915,167 A | 6/1999 | Leedy | |
| 6,100,200 A | 8/2000 | Van Buskirk et al. | |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Trang Q Tran
(74) *Attorney, Agent, or Firm* — The Marbury Law Group PLLC

(57) ABSTRACT

A three-dimensional memory device includes an alternating stack of insulating layers and electrically conductive layers located over a substrate, and memory stack structures extending through the alternating stack. Each of the memory stack structures comprises a memory film and a vertical semiconductor channel contacting an inner sidewall of the memory film. The electrically conductive layers include aluminum and silicon and provide low resistance electrically conductive paths as word lines of the three-dimensional memory device. The aluminum-based electrically conductive layers can provide low resistivity, low mechanical stress, and thermal stability for use as high performance word lines.

10 Claims, 35 Drawing Sheets

(51) Int. Cl.
   *H01L 27/11565* (2017.01)
   *H01L 27/11524* (2017.01)

(56) References Cited

U.S. PATENT DOCUMENTS

| | | | |
|---|---|---|---|
| 8,241,979 | B2 | 8/2012 | Park et al. |
| 8,349,681 | B2 | 1/2013 | Alsmeier et al. |
| 8,492,238 | B2 | 7/2013 | Celik-Butler et al. |
| 9,230,984 | B1 | 1/2016 | Takeguchi |
| 9,419,135 | B2 | 8/2016 | Baenninger et al. |
| 9,437,543 | B2 | 9/2016 | Nakada et al. |
| 9,478,495 | B1 | 10/2016 | Pachamuthu et al. |
| 9,627,395 | B2 | 4/2017 | Zhang et al. |
| 2010/0102403 | A1 | 4/2010 | Celik-Butler et al. |
| 2010/0323489 | A1 | 12/2010 | Park et al. |
| 2014/0145345 | A1 | 5/2014 | Brunner et al. |
| 2014/0252455 | A1 | 9/2014 | Chuang et al. |
| 2015/0076580 | A1* | 3/2015 | Pachamuthu ..... H01L 27/11551 257/314 |
| 2016/0300849 | A1 | 10/2016 | Chan |
| 2017/0084624 | A1* | 3/2017 | Lee ................... H01L 27/11582 |
| 2017/0243873 | A1* | 8/2017 | Kobayashi ........ H01L 29/42364 |
| 2017/0287925 | A9 | 10/2017 | Makala et al. |
| 2017/0294388 | A1* | 10/2017 | Yoon ................. H01L 27/11582 |
| 2017/0352669 | A1 | 12/2017 | Sharangpani et al. |
| 2018/0019256 | A1 | 1/2018 | Amano et al. |

OTHER PUBLICATIONS

Nast, O. et al., "Polycrystalline Silicon Thin Films on Glass by Aluminum Induced Crystallization," Abstract from IEEE Transactions on Electron Devices, vol. 46, Issue 10, 3 pages, (1999).
http://www.engineeringtoolbox.com/young-modulus-d_417.html, Young's Modulus—Tensile and Yield Strength for Common Materials, 7 pages, viewed on Jul. 11, 2018.
U.S. Appl. No. 15/804,692, filed Nov. 6, 2017, SanDisk Technologies.
U.S. Appl. No. 15/992,603, filed May 30, 2018, SanDisk Technologies.
U.S. Appl. No. 16/019,904, filed Jun. 27, 2018, SanDisk Technologies.
Al Si Alloy phase diagram, https://www.southampton.ac.uk~pasr1/al-si.htm visited Jul. 30, 2018.
Ye, H., et al., "An Overview of the Development of Al—Si-Alloy Based Material for Engine Applications," Journal of Materials Engineering and Performance, vol. 12, No. 3, pp. 288-297, (2003).
Zhang, D. et al., "Three-Mask Polycrystalline Silicon TFT With Metallic Gate and Junctions," IEEE Electron Device Letters, vol. 27, No. 7, pp. 564-566, (2006).
Saraswat, "Advances in the multilevel interconnect technology," Interconnections: Aluminum Metalization, Standford University, 25 pages, (2003).
Sridhar, N. et al., "Polysilicon films of high photoresponse, obtained by vacuum annealing of aluminum capped hydrogenated amorphous silicon," Journal of Applied Physics, vol. 78, No. 12, pp. 7304-7312; doi: 10.1063/1.360769 (1995).
Nast, O. et al., "Polycrystalline Silicon Thin Films on Glass by Aluminum-Induced Crystallization," IEEE Transaction on Electron Devices, vol. 46, No. 10, pp. 2062-2068, (1999).
Nikanorov, S.P. et al., "Structural and mechanical properties of Al—Si alloys obtained by fast cooling of a levitated melt," Materials Science and Engineering, vol. A390, pp. 63-69, (2005).
Lee, Y.J. et al., "Atomic Layer Deposition of Aluminum Thin Films Using an Alternating Supply of Trimethylaluminum and a Hydrogen Plasma," Abstract from Electrochem. Solid-State Lett. vol. 5, Issue 10, pp. C91-C93; doi: 10.1149/1.1503204, (2002).
Xiong Yu-Qing, et al., "Characteristics and properties of metal aluminum thin films prepared by electron cyclotron resonance plasma-assisted atomic layer deposition technology", Abstract, Chinese Physics B, vol. 21, No. 7 (2012).
Office Communication, Notice of Allowance and Fee(s) Due from the U.S. Patent and Trademark Office for the U.S. Appl. No. 16/019,904, dated Dec. 16, 2019, 15 pages.
Office Communication, Notice of Allowance and Fee(s) Due, from the USPTO for U.S. Appl. No. 16/019,904, dated Aug. 23, 2019, 15 pages.

\* cited by examiner

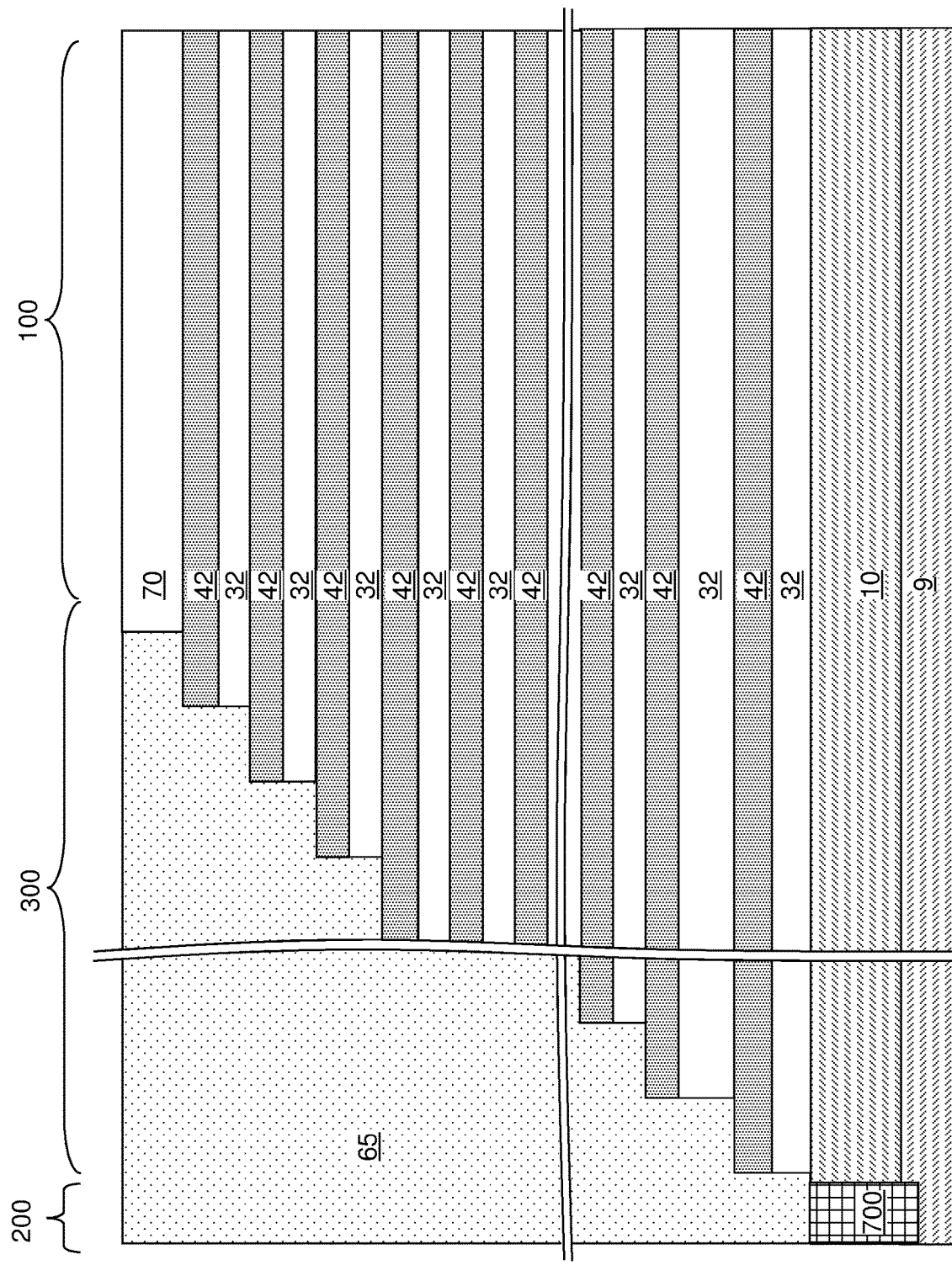

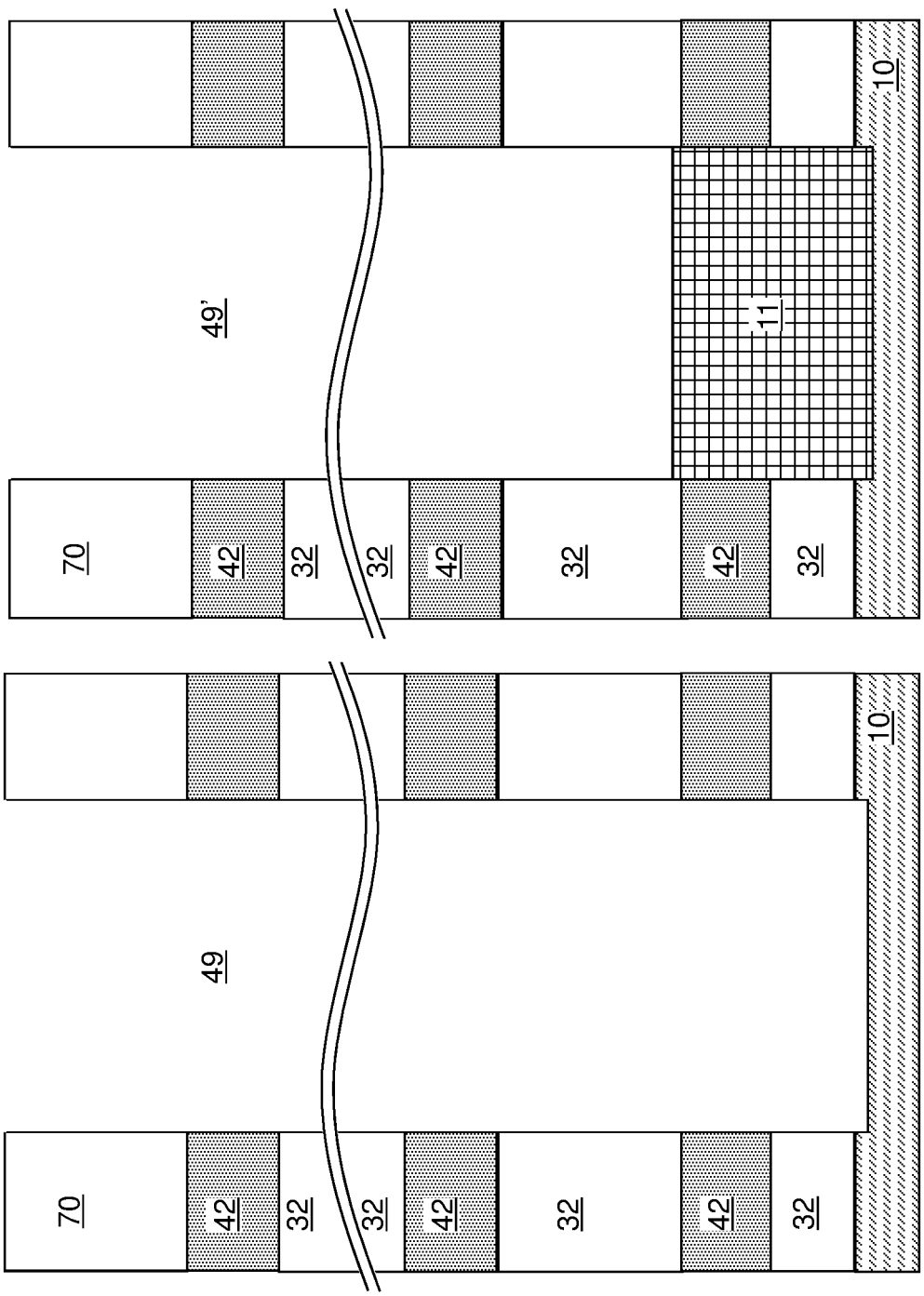

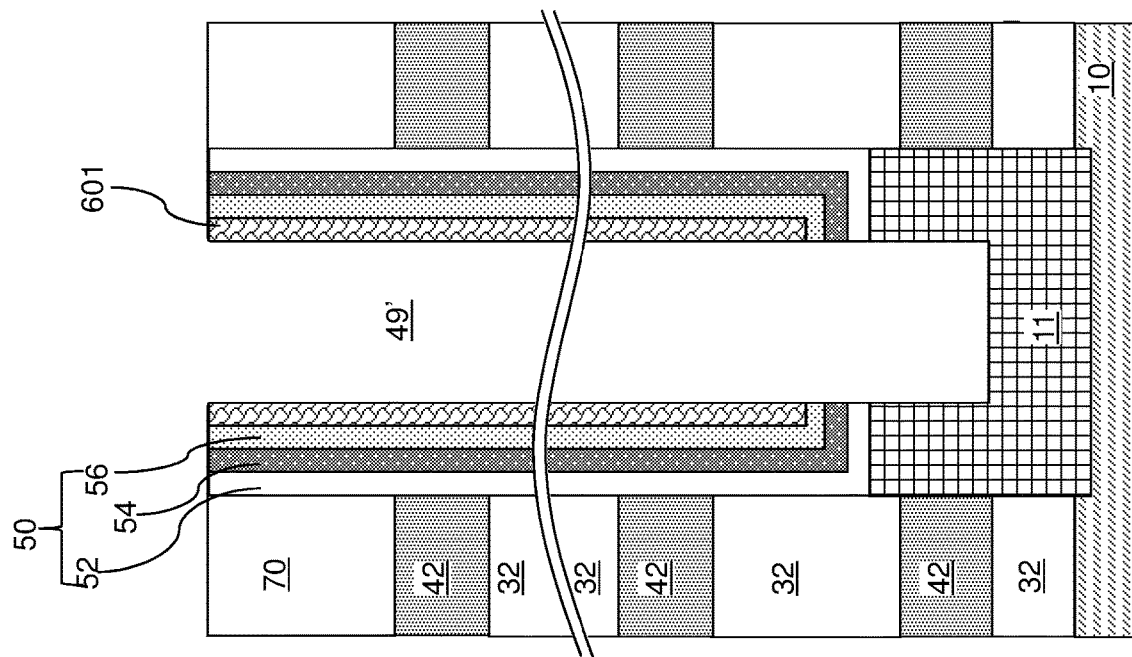
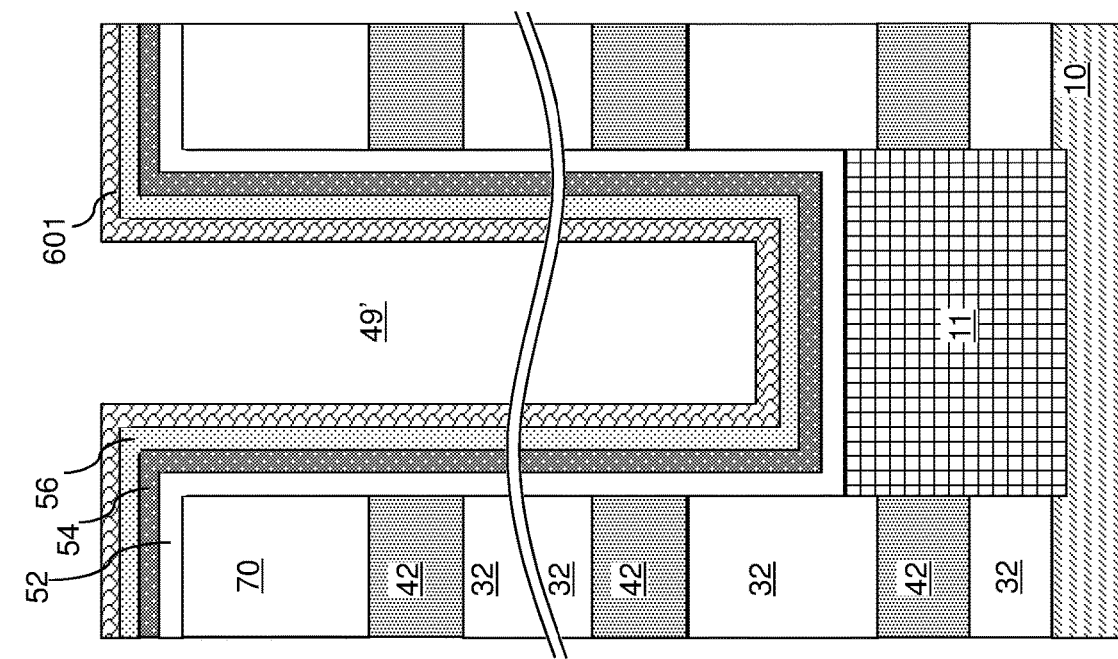

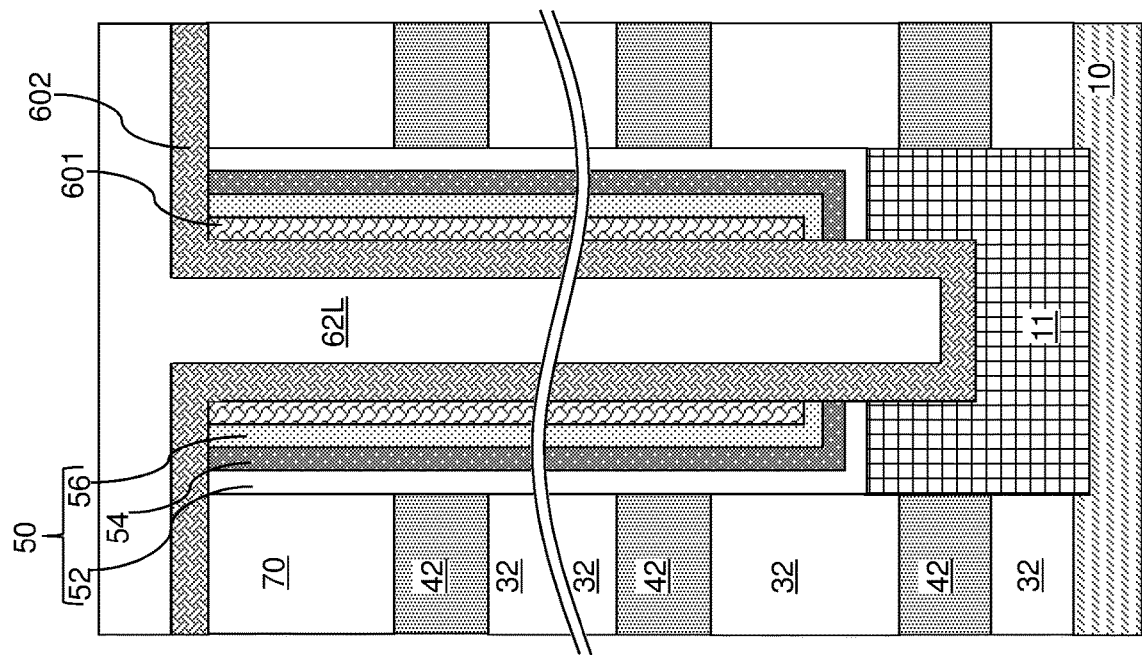
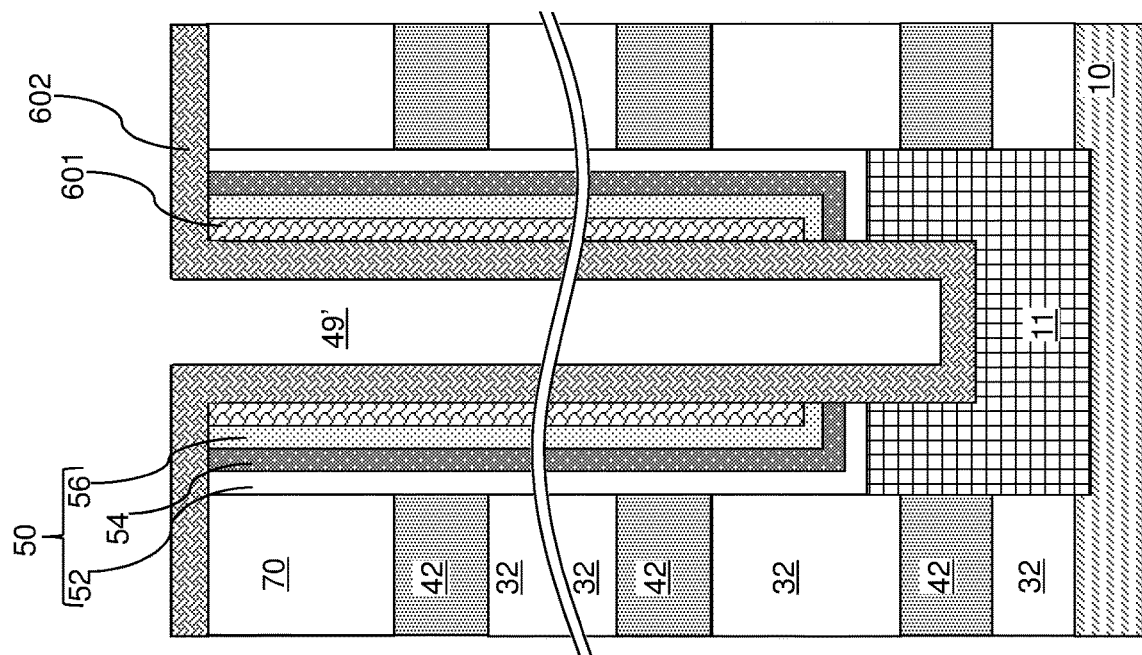

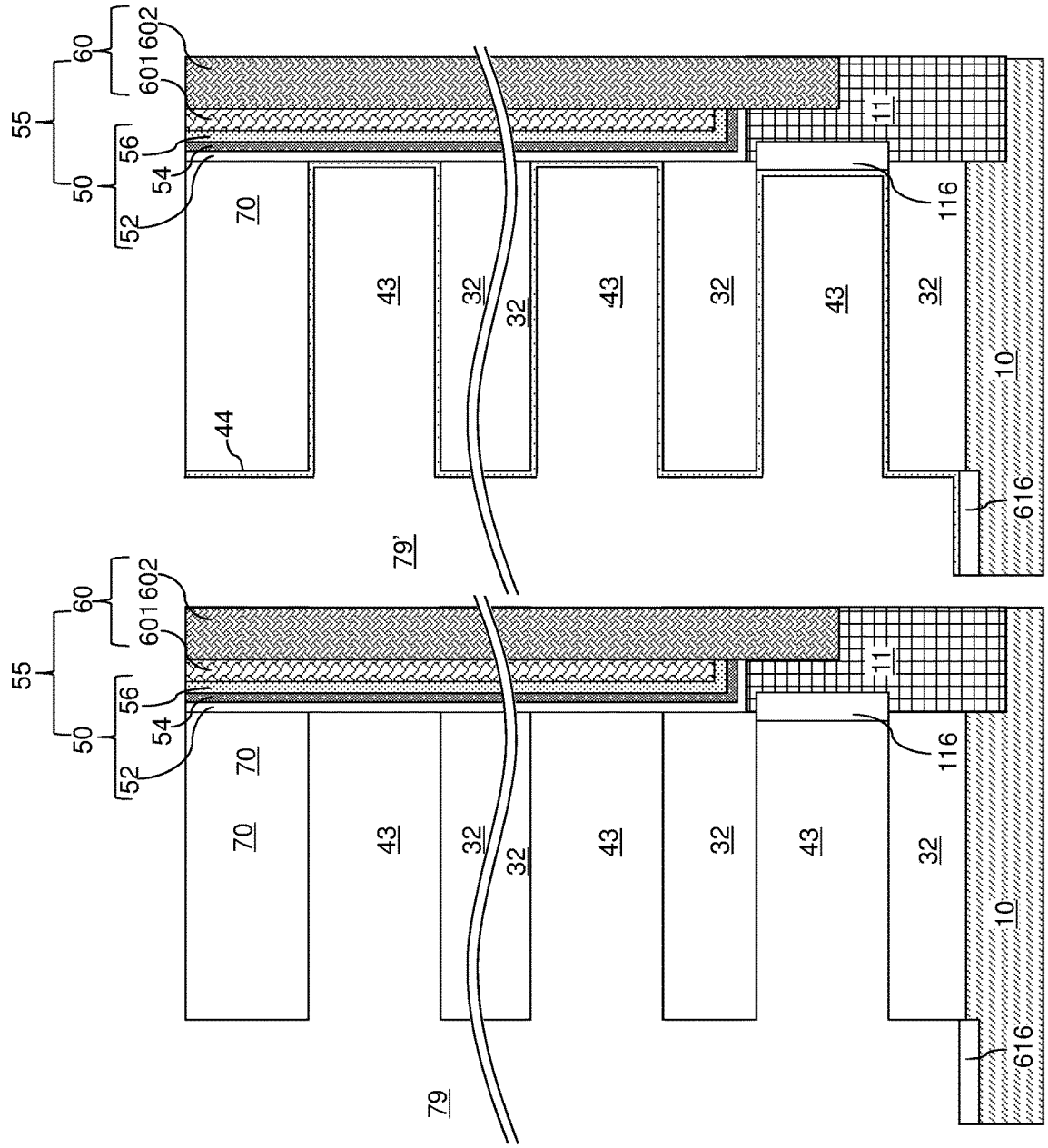

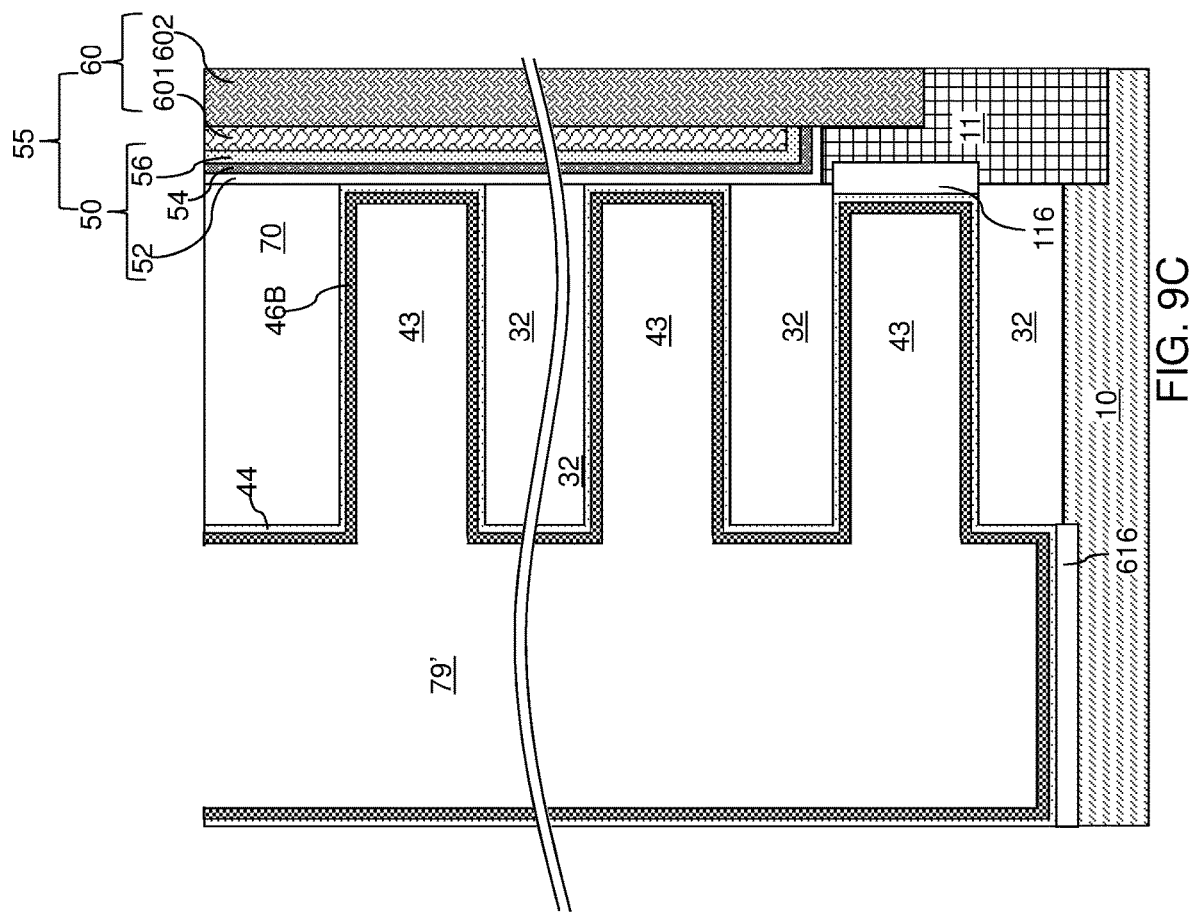

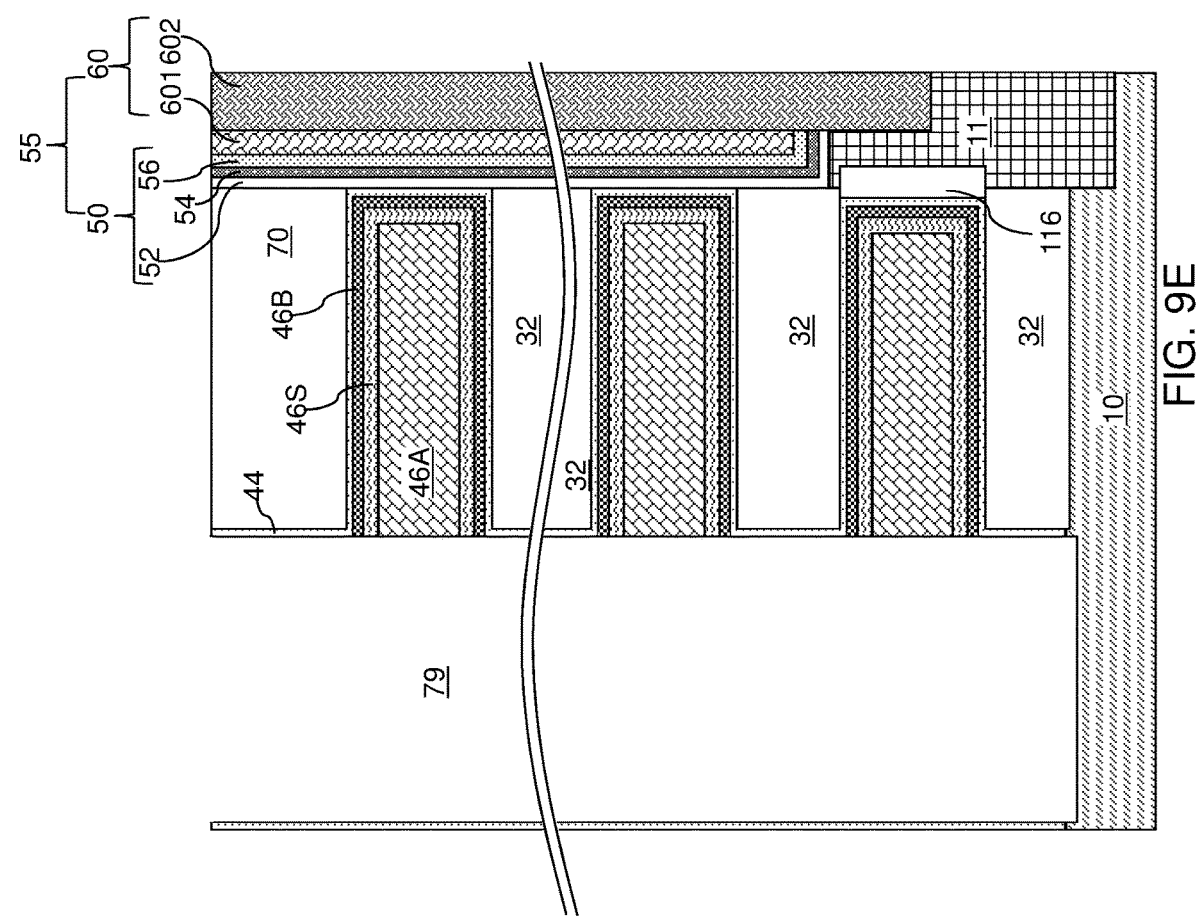

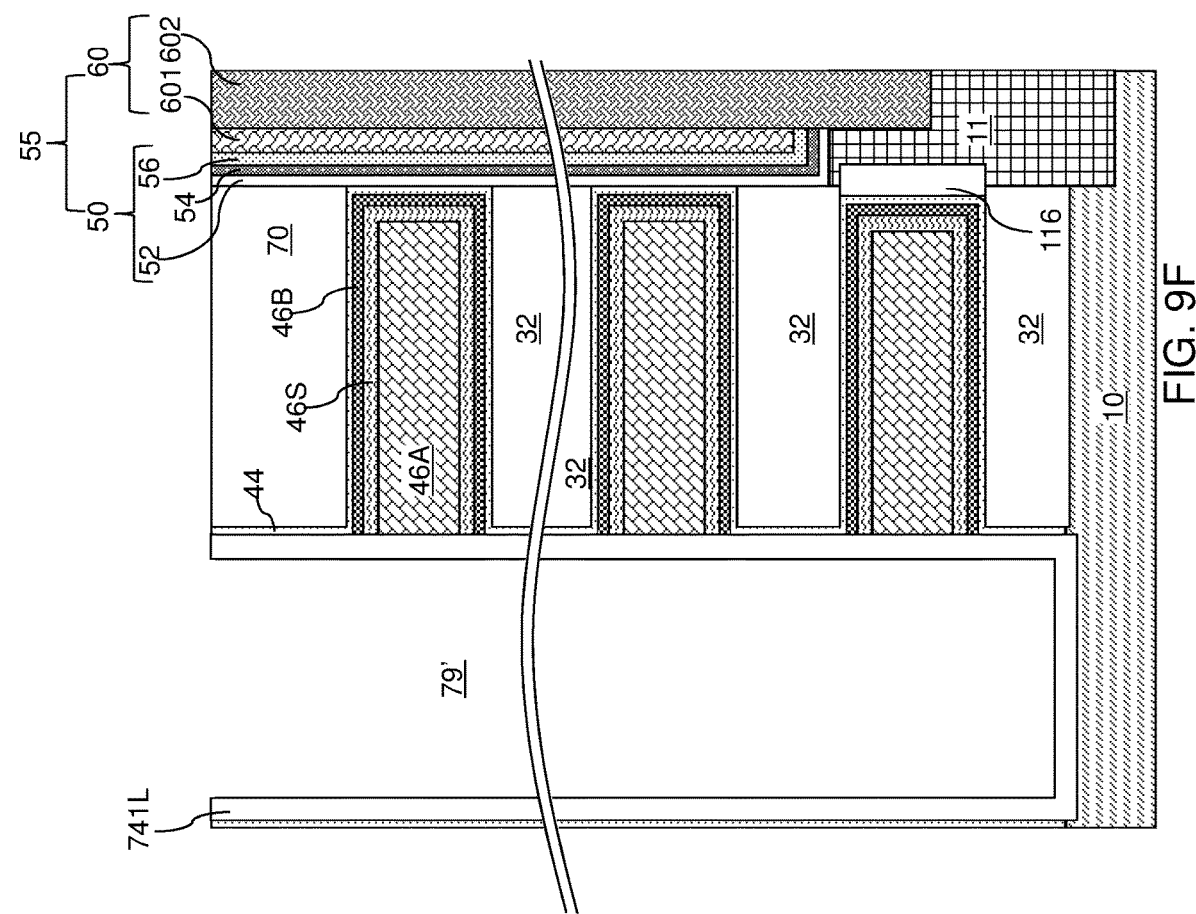

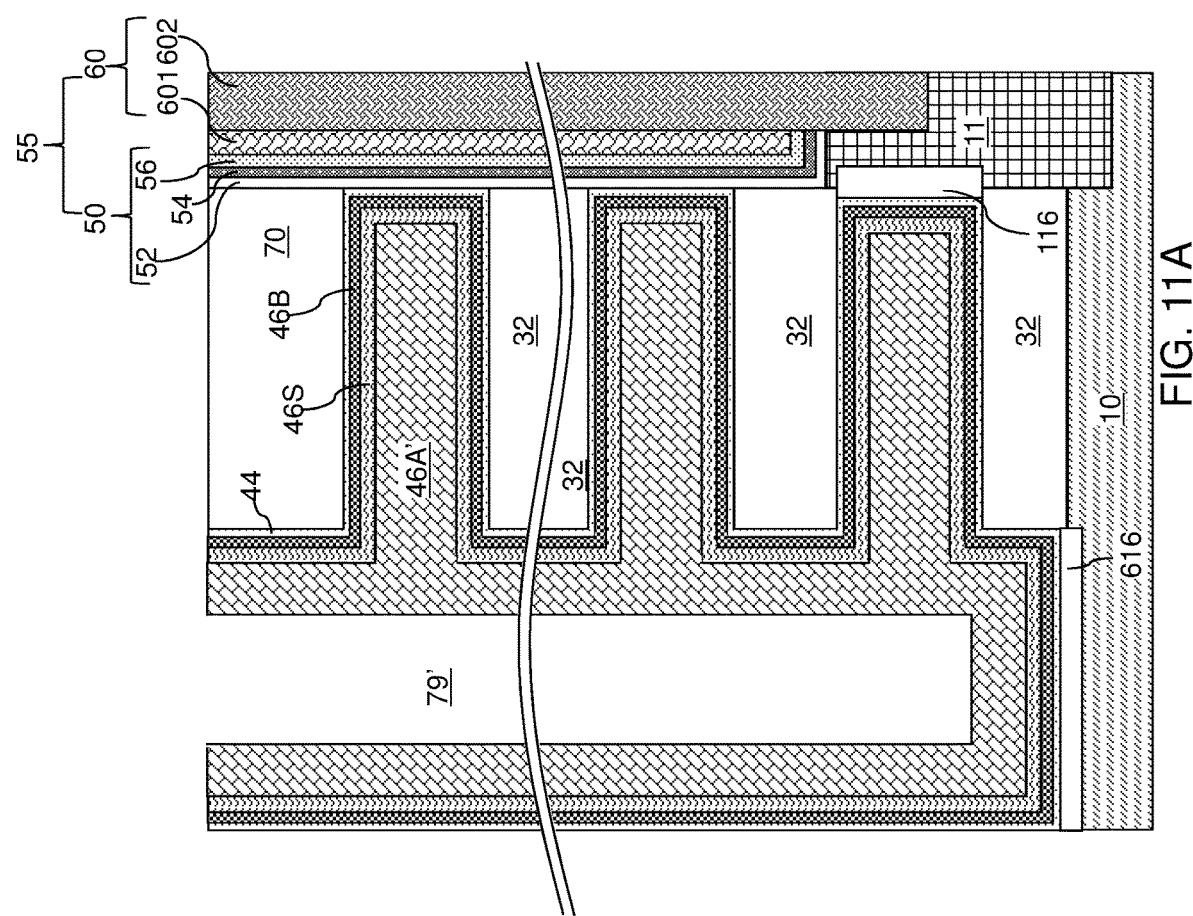

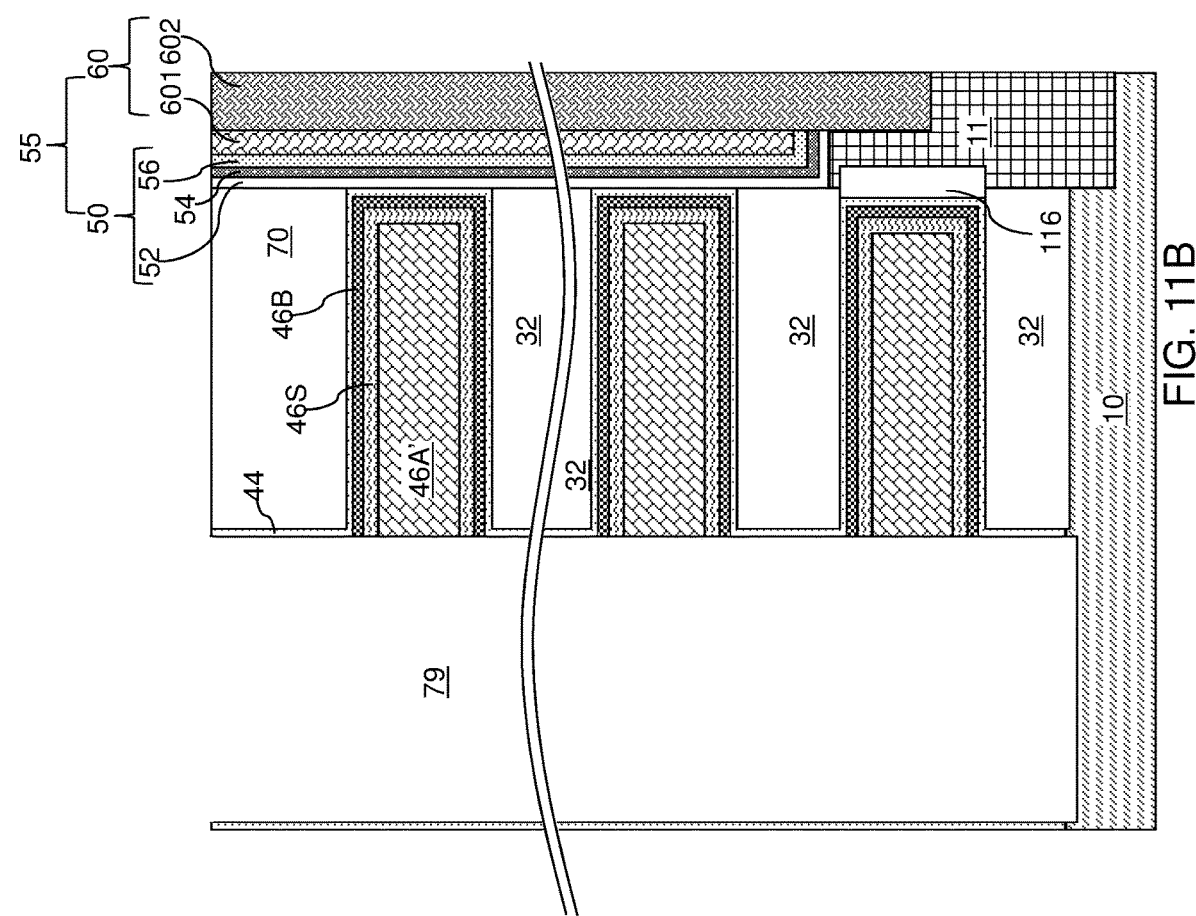

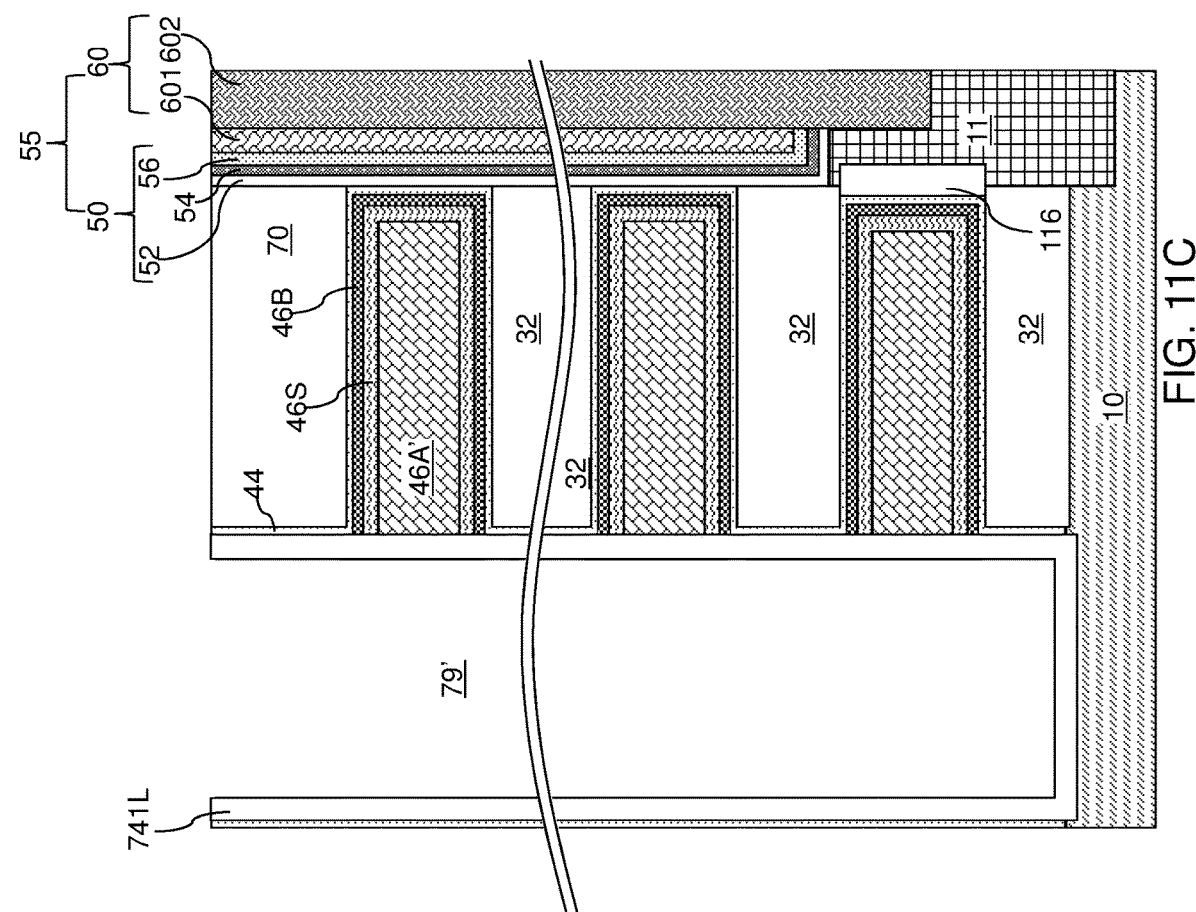

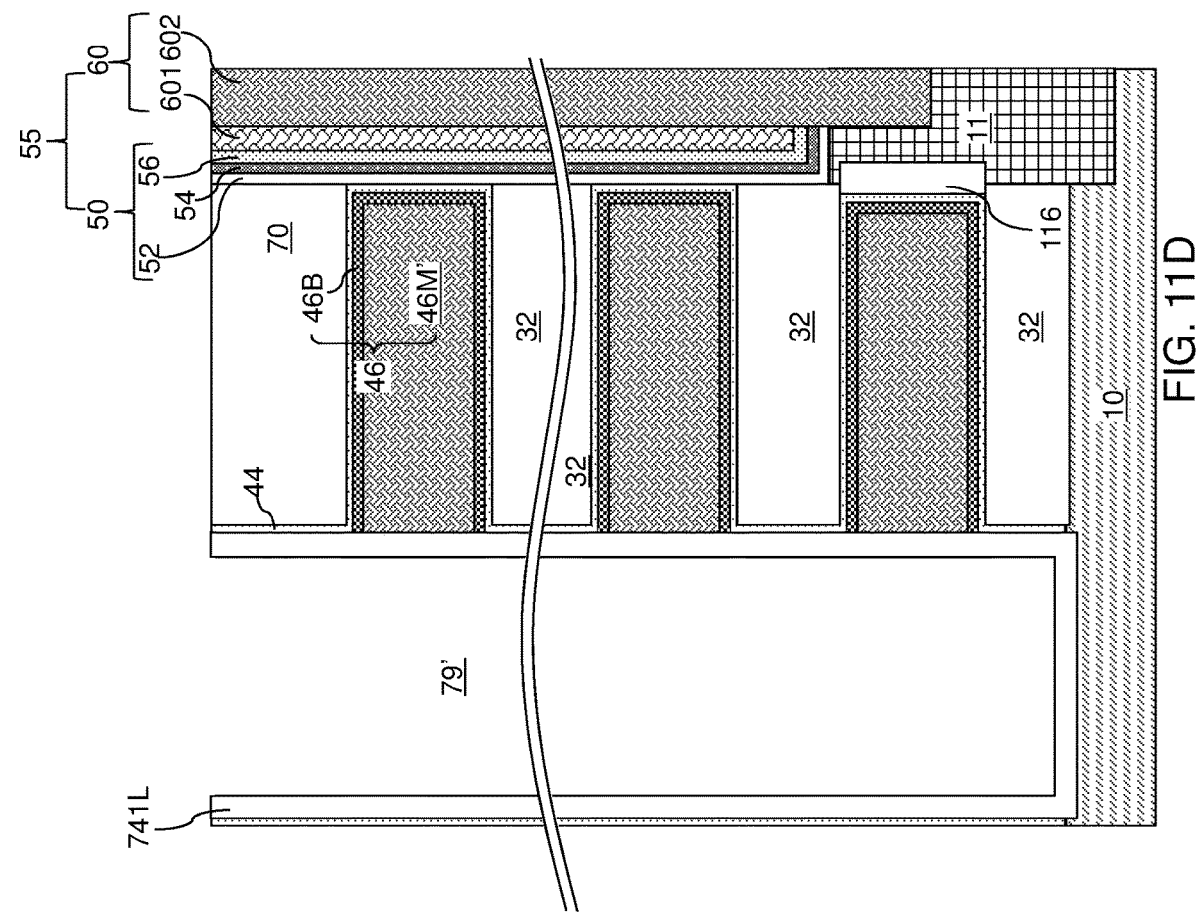

THREE-DIMENSIONAL MEMORY DEVICE CONTAINING ALUMINUM-SILICON WORD LINES AND METHODS OF MANUFACTURING THE SAME

FIELD

The present disclosure relates generally to the field of semiconductor devices, and particularly to a three-dimensional memory device containing word lines including aluminum and silicon and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; and memory stack structures extending through the alternating stack, wherein each of the memory stack structures comprises a memory film and a vertical semiconductor channel contacting an inner sidewall of the memory film, and extends through each of the electrically conductive layers and is laterally surrounded by each of the electrically conductive layers, wherein each of the electrically conductive layers includes a respective metallic alloy material portion including aluminum and silicon, and wherein at least 40% of all atoms within the metallic alloy material portion are aluminum atoms and at least 1% of all atoms within the metallic alloy material portions are silicon atoms.

According to another aspect of the present disclosure, a method of forming a three-dimensional memory device is provided, which comprises: forming an alternating stack of insulating layers and sacrificial material layers over a substrate; forming memory stack structures extending through the alternating stack, wherein each of the memory stack structures comprises a memory film and a vertical semiconductor channel contacting an inner sidewall of the memory film; and replacing the sacrificial material layer with material portions including electrically conductive layers, wherein the electrically conductive layers are formed at each level of the sacrificial material layers, and each of the electrically conductive layers includes a respective metallic alloy material portion including aluminum and silicon.

According to yet another aspect of the present disclosure, a three-dimensional memory device is provided, which comprises: an alternating stack of insulating layers and electrically conductive layers located over a substrate; and memory stack structures extending through the alternating stack, wherein each of the memory stack structures comprises a memory film and a vertical semiconductor channel contacting an inner sidewall of the memory film, and extends through each of the electrically conductive layers and is laterally surrounded by each of the electrically conductive layers, wherein each of the electrically conductive layers comprises a respective conductive fill material structure including an aluminum portion surrounded on at least three sides by a silicon portion.

According to still another aspect of the present disclosure, a method of forming a three-dimensional memory device is provided, which comprises: forming an alternating stack of insulating layers and sacrificial material layers over a substrate; forming memory stack structures extending through the alternating stack, wherein each of the memory stack structures comprises a memory film and a vertical semiconductor channel contacting an inner sidewall of the memory film; and replacing the sacrificial material layer with material portions including electrically conductive layers, each of which includes an aluminum-containing portion surrounded on at least three sides by a silicon-containing portion.

BRIEF DESCRIPTION OF THE DRAWINGS

FIG. 3 is a schematic vertical cross-sectional view of the first exemplary structure after formation of stepped terraces and a retro-stepped dielectric material portion according to the first embodiment of the present disclosure.

FIGS. 5A-5H are sequential schematic vertical cross-sectional views of a memory opening within the first exemplary structure during formation of a memory stack structure, an optional dielectric core, and a drain region therein according to the first embodiment of the present disclosure.

FIGS. 9A-9G are sequential vertical cross-sectional views of a region of the first exemplary structure during formation of first exemplary electrically conductive layers according to the first embodiment of the present disclosure.

FIGS. 11A-11D are sequential vertical cross-sectional views of a region of the first exemplary structure during formation of an alternative embodiment of the first exemplary electrically conductive layers according to the first embodiment of the present disclosure.

DETAILED DESCRIPTION

Figure 1:
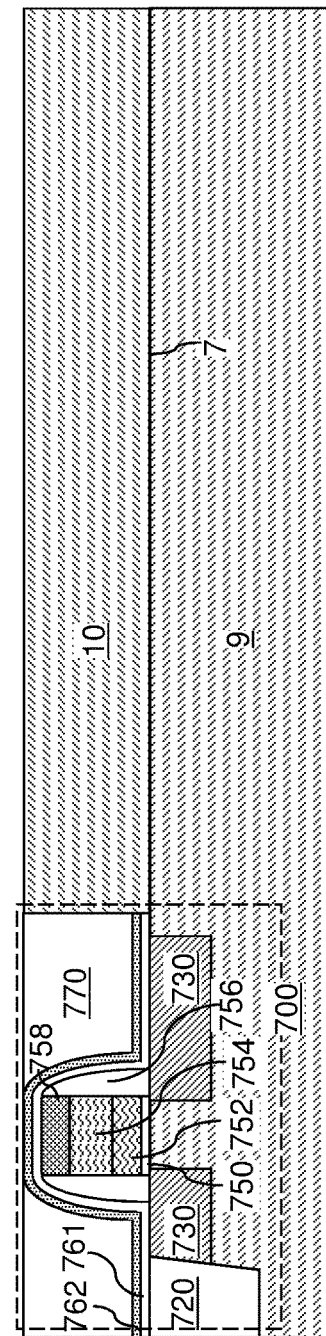
FIG. 1 is a schematic vertical cross-sectional view of a first exemplary structure after formation of at least one peripheral device and a semiconductor material layer according to a first embodiment of the present disclosure.

Word lines in three-dimensional NAND memory devices typically employ tungsten as the conductive material. While tungsten provides satisfactory electrical conductivity for three-dimensional memory devices of prior generations, reduction in the resistivity of the conductive materials of the word lines is desired to maintain or improve performance as the three-dimensional memory devices scale to smaller dimension. Further, tungsten generates a high level of mechanical stress, and future three-dimensional memory devices employing tungsten word lines are expected to be under severe mechanical stress, thereby reducing device reliability and limiting the total number of word lines that can be formed over a substrate. In one embodiment of the present disclosure aluminum and silicon containing word lines provide higher electrical conductivity and lower mechanical stress than tungsten-based word lines. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
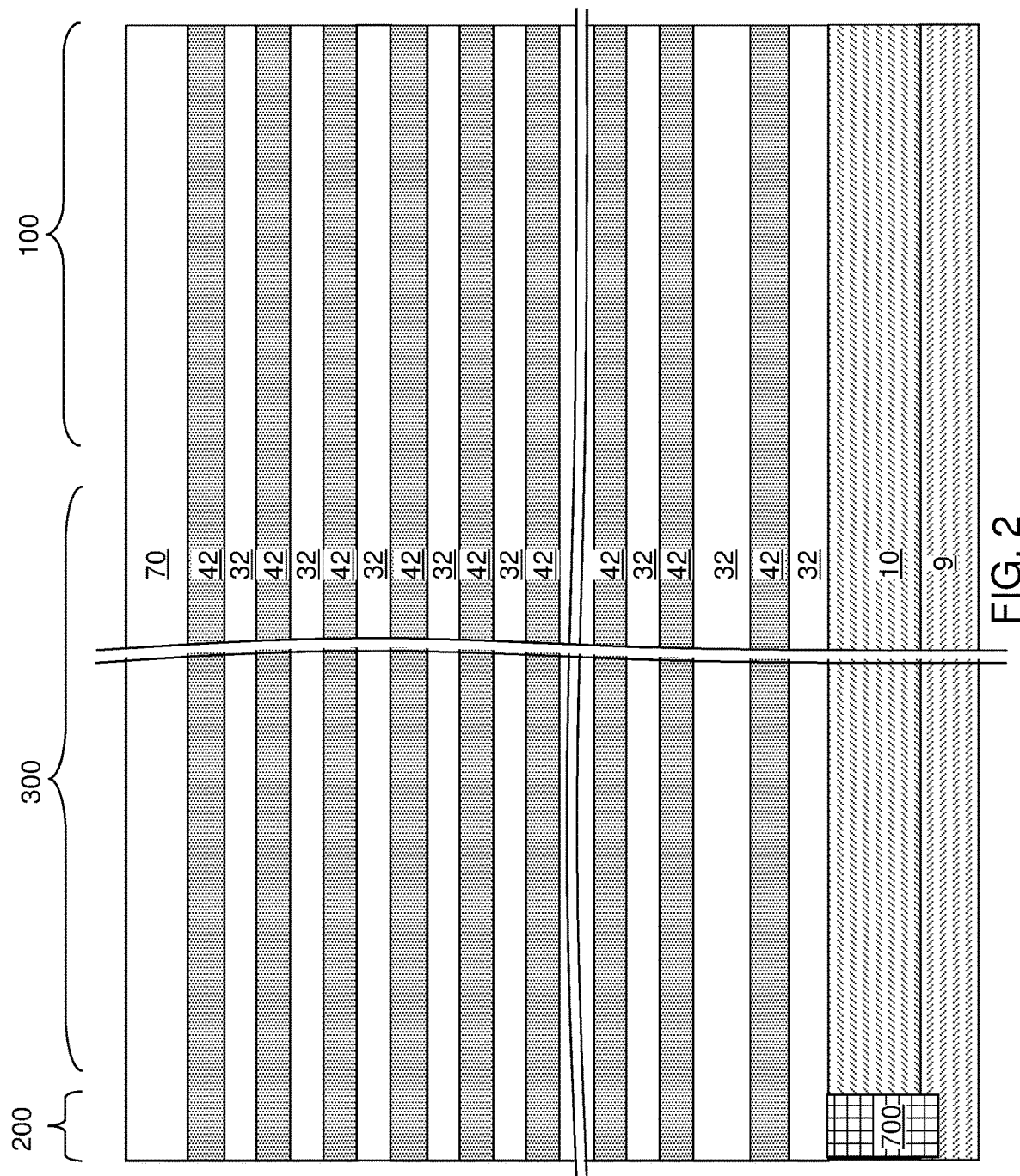
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
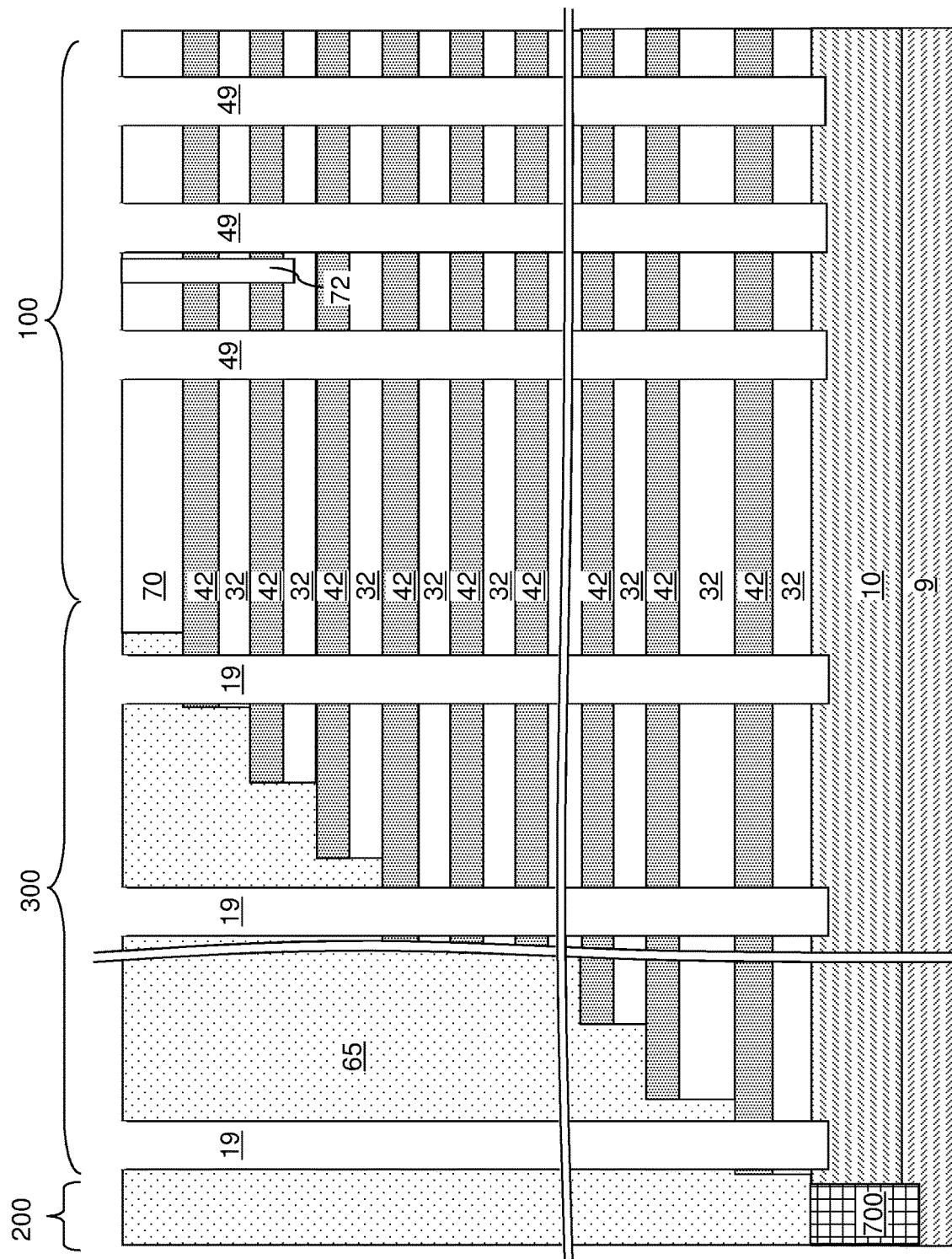
FIG. 4A is a schematic vertical cross-sectional view of the first exemplary structure after formation of memory openings and support openings according to the first embodiment of the present disclosure.
Figure 4B:
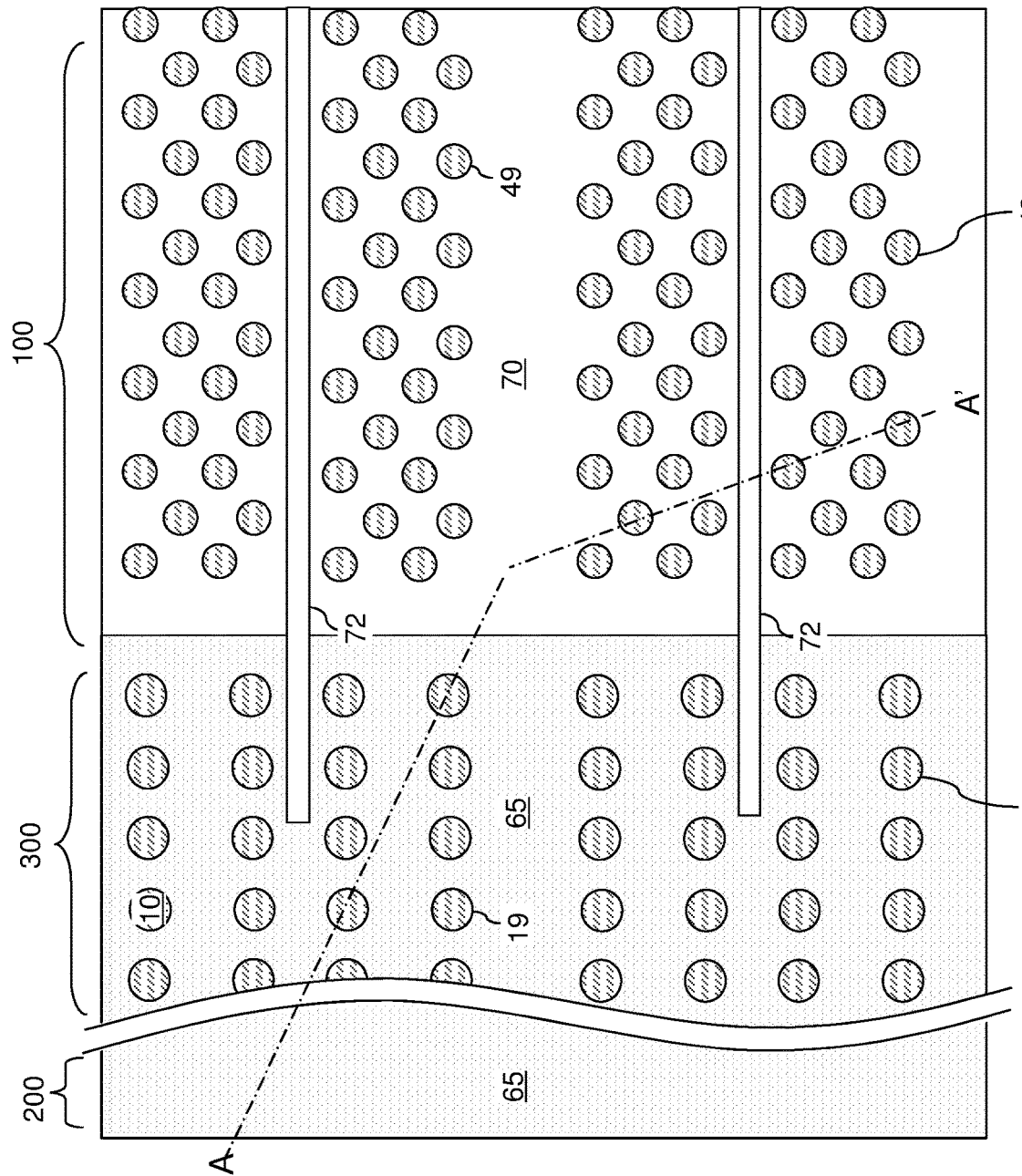
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5H:
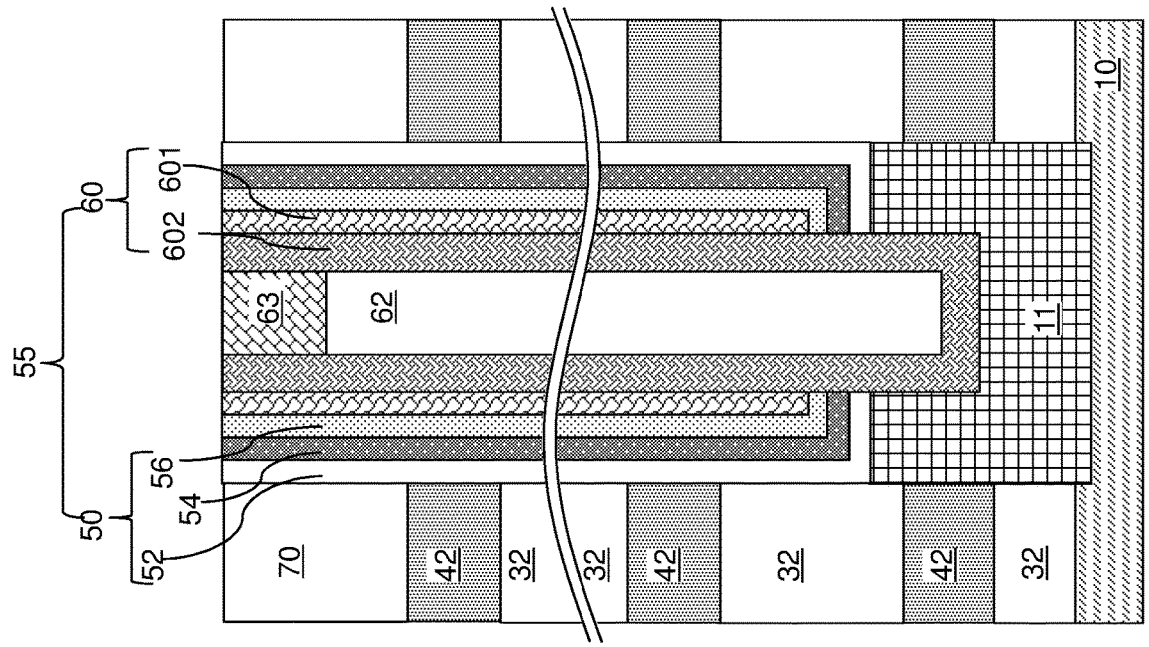
Figure 5G:
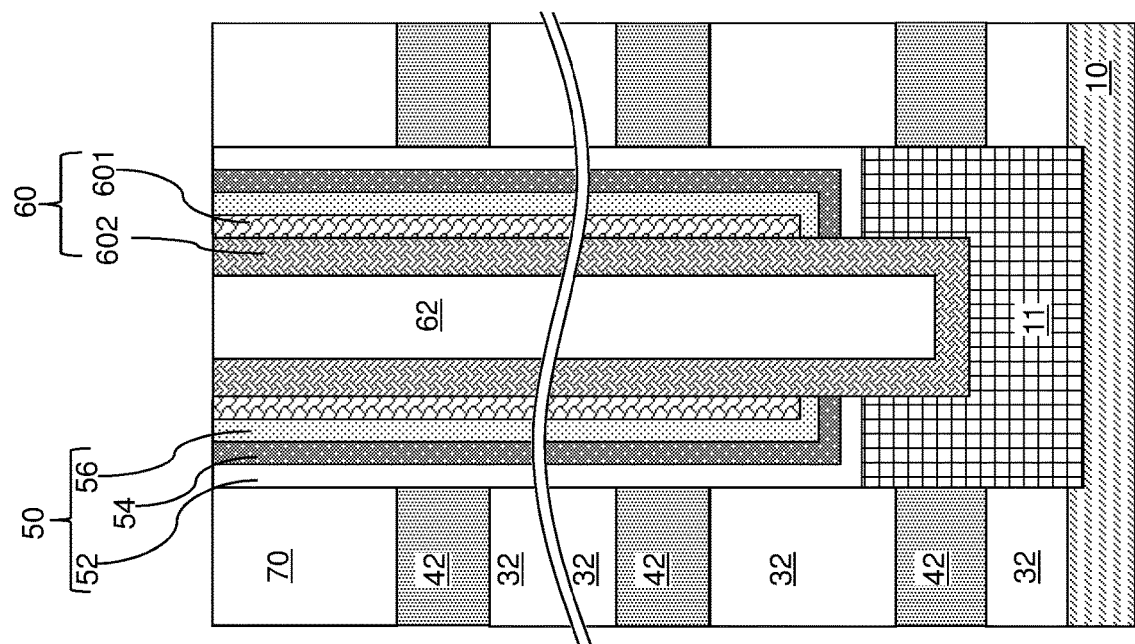

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
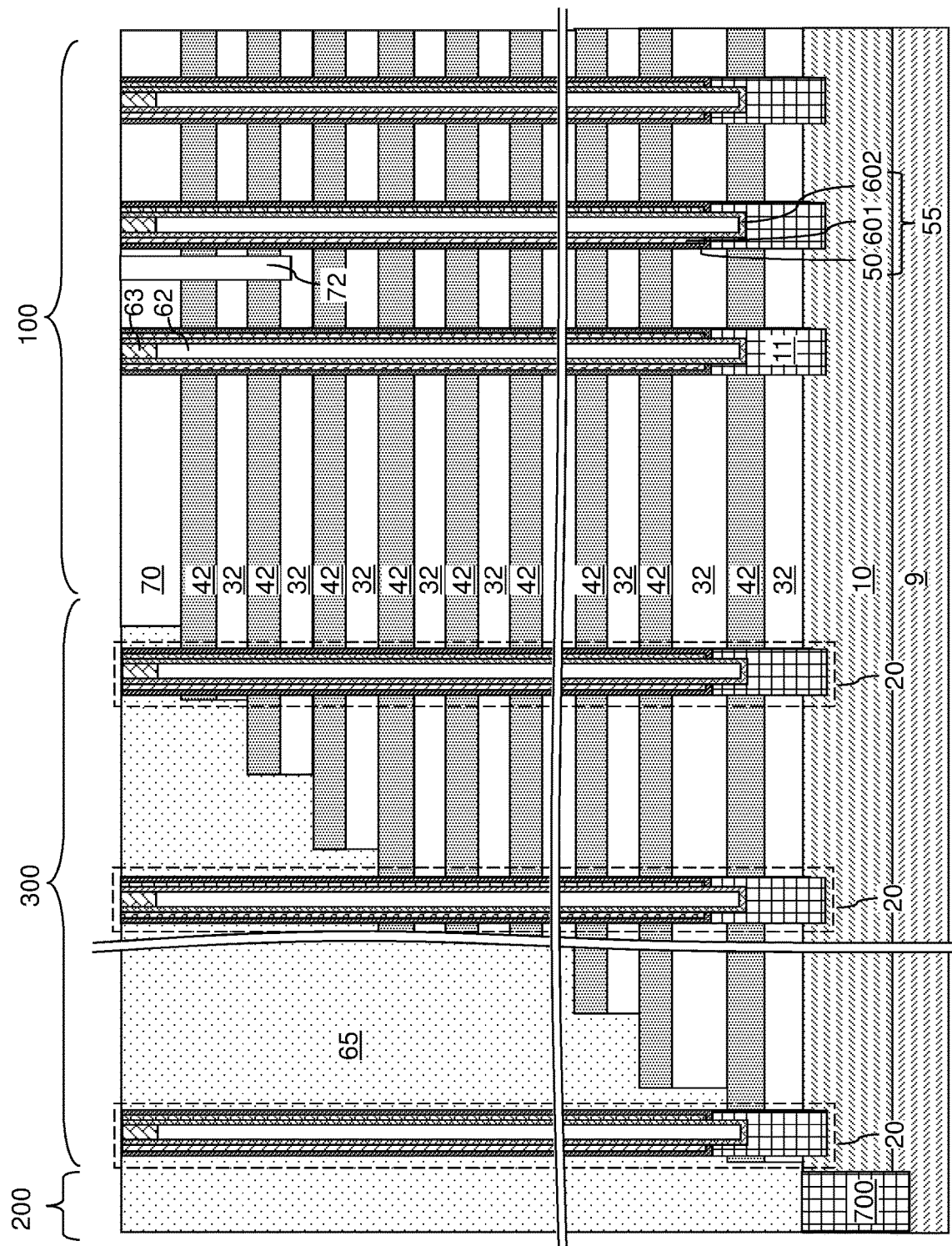
FIG. 6 is a schematic vertical cross-sectional view of the first exemplary structure after formation of memory stack structures and support pillar structures according to the first embodiment of the present disclosure.

Referring to FIG. 6, the first exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50.

The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
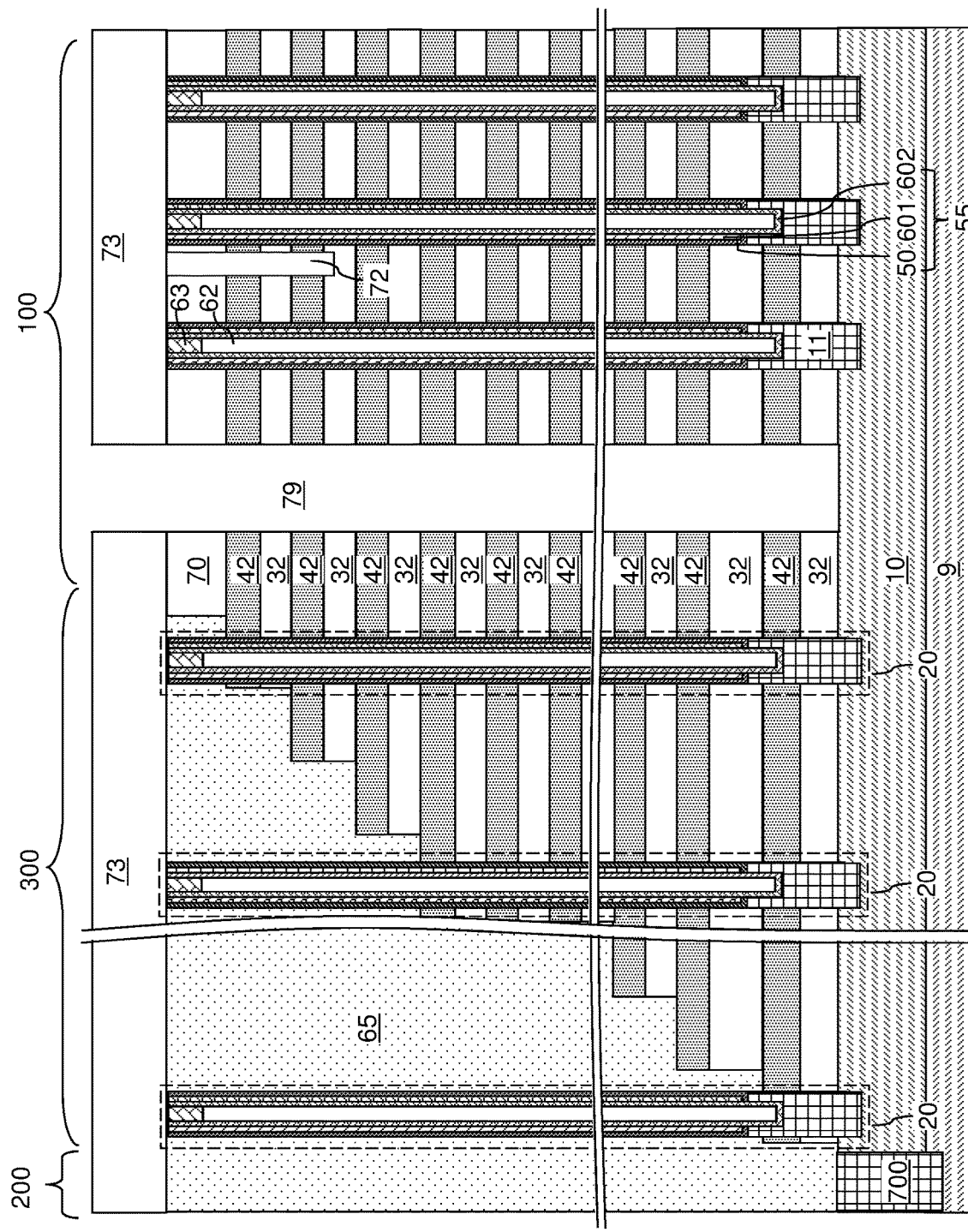
FIG. 7A is a schematic vertical cross-sectional view of the first exemplary structure after formation of backside trenches according to the first embodiment of the present disclosure.
Figure 7B:
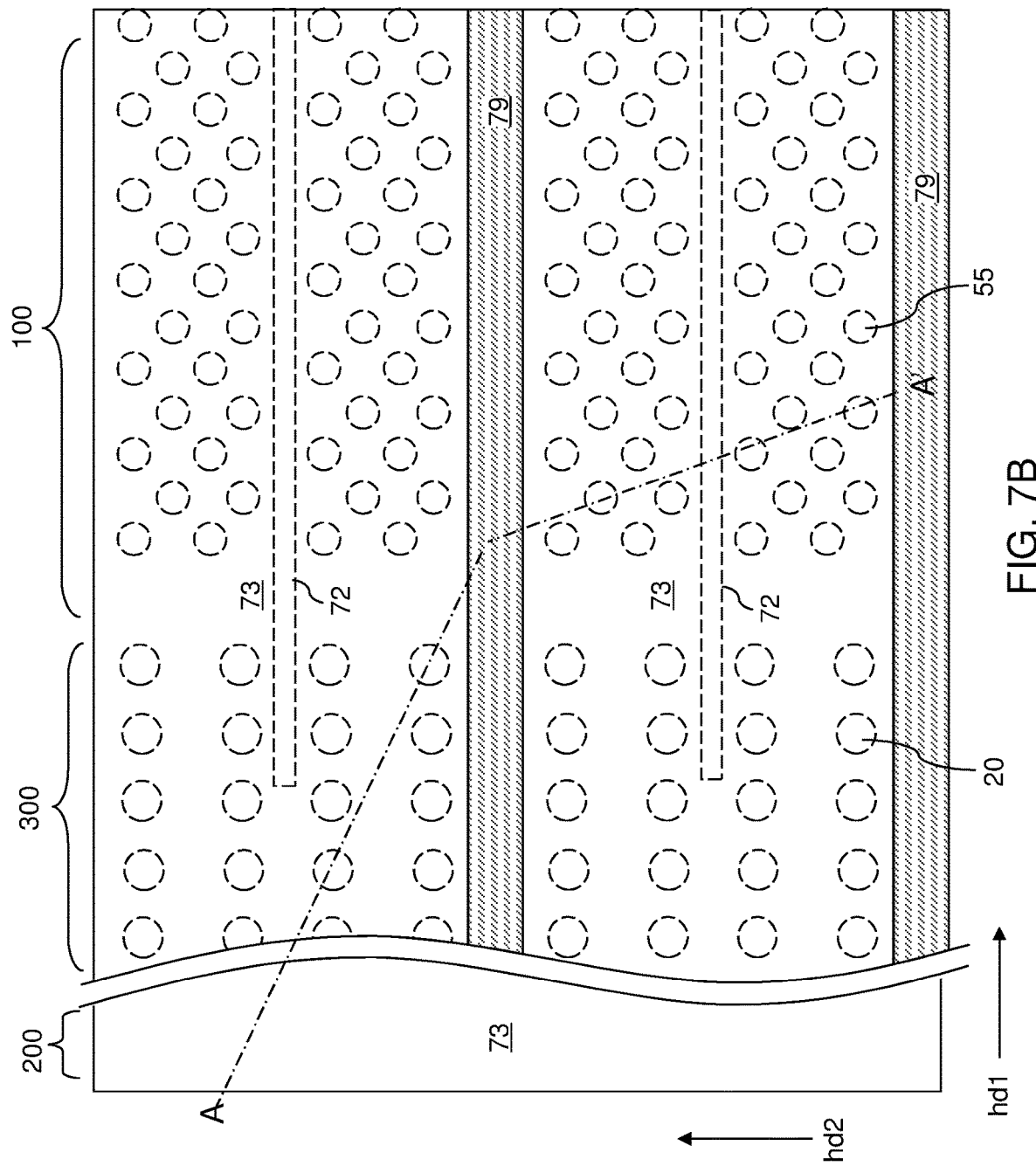
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
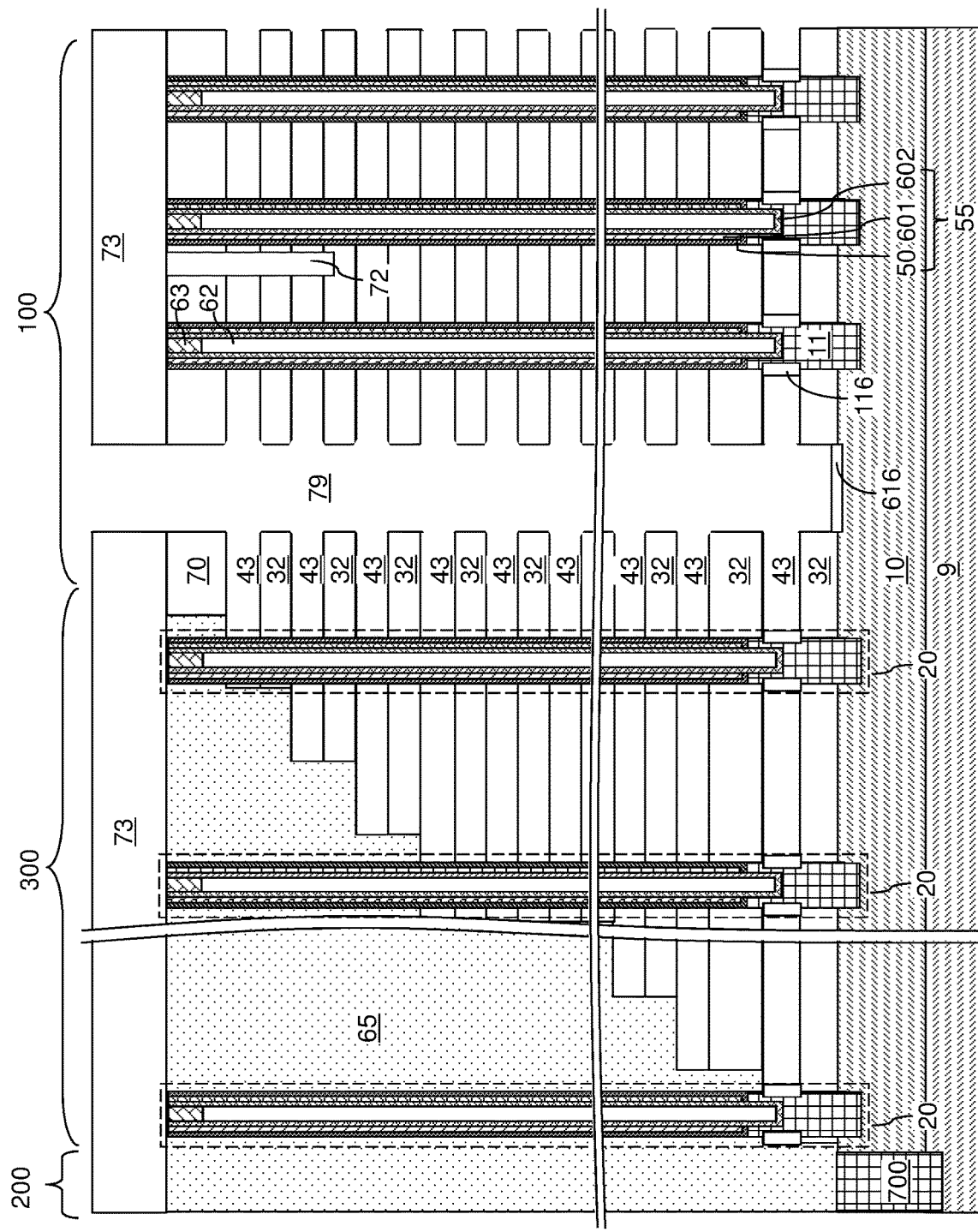
FIG. 8 is a schematic vertical cross-sectional view of the first exemplary structure after formation of backside recesses according to the first embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the first exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present. In one embodiment, both blocking dielectric layers 44 and 52 are present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The backside blocking dielectric layer 44 can also consist of other dielectric material that may include one or more metal oxides, silicon oxide, and other suitable dielectric materials. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46B can be deposited in the backside recesses 43. The metallic barrier layer 46B includes an electrically conductive metallic material that can function as a diffusion barrier layer and/or adhesion promotion layer for a metallic fill material to be subsequently deposited. The metallic barrier layer 46B can include a conductive metallic nitride material such as TiN, TaN, WN, or a stack thereof, or can include a conductive metallic carbide material such as TiC, TaC, WC, or a stack thereof. In one embodiment, the metallic barrier layer 46B can be deposited by a conformal deposition process such as chemical vapor deposition (CVD) or atomic layer deposition (ALD). The thickness of the metallic barrier layer 46B can be in a range from 2 nm to 8 nm, such as from 3 nm to 6 nm, although lesser and greater thicknesses can also be employed. In one embodiment, the metallic barrier layer 46B can consist essentially of a conductive metal nitride such as TiN.

Figure 9D:
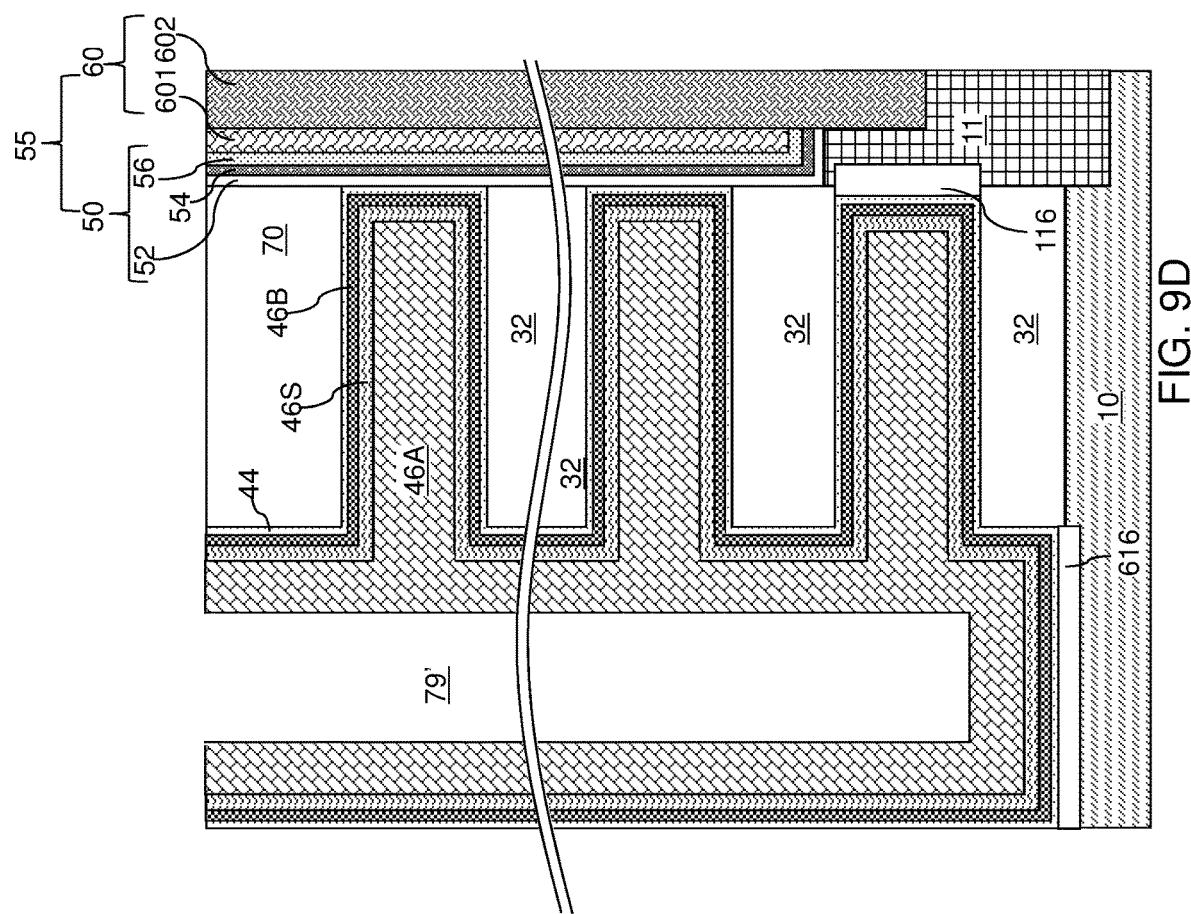

Referring to FIG. 9D, a silicon-containing material layer 46S can be conformally deposited on the metallic barrier layer 46B. The silicon-containing material layer 46S includes a silicon-containing semiconductor material. In one embodiment, the silicon-containing material layer 46S includes silicon and may optionally include one or more additional semiconductor material and/or p-type dopant atoms such as boron. In one embodiment, the silicon-containing material layer 46S can consist essentially of at least one semiconductor material including silicon and optional p-type dopant atoms. In one embodiment, the silicon-containing material layer 46S can consist essentially of undoped silicon, p-doped silicon, an undoped silicon-germanium alloy, a p-doped silicon-germanium alloy, an undoped silicon-germanium-carbon alloy, or a p-doped silicon-germanium-carbon alloy. In one embodiment, the silicon-containing material layer 46S can include an amorphous semiconductor material. In one embodiment, the silicon-containing material layer 46S can include amorphous silicon or an amorphous silicon-germanium alloy. The silicon-containing material layer 46S cab be deposited at peripheral portions of the backside recesses by a conformal deposition process such as low pressure chemical vapor deposition (LPCVD) or atomic layer deposition (ALD). The thickness of the silicon-containing material layer 46S can be selected such that an atomic concentration of semiconductor atoms (such as silicon atoms) is in a target range within a silicon-aluminum alloy to be subsequently formed. Specifically, the thickness of the silicon-containing material layer 46S can be selected depending on the required silicon content in aluminum-silicon alloy material portions to be subsequently formed. The target silicon content can be determined based on the thermal stability, resistance, and mechanical stress of the aluminum-silicon alloy material portions to be subsequently formed.

An aluminum-containing material layer 46A including an aluminum-containing material is conformally deposited on the silicon-containing material layer 46S by a conformal deposition process. The aluminum-containing material layer 46A can consist essentially of aluminum or a combination of aluminum and at least another metal. In one embodiment, the aluminum-containing material layer 46A can consist essentially of aluminum. The conformal deposition process that deposits the aluminum-containing material of the aluminum-containing material layer 46A can comprise low pressure chemical vapor deposition (LPCVD) or atomic layer deposition (ALD). The duration of the conformal deposition process can be selected that each remaining volume of the backside recesses 43 is filled with the aluminum-containing material layer 46A.

The conformal deposition process can employ at least one aluminum precursor gas. The at least one aluminum precursor gas can be selected from trimethylaluminum (Al(CH$_3$)$_3$; TMA), dimethylaluminumchloride (Al(CH$_3$)$_2$Cl, and dimethylaluminum hydride ((CH$_3$)$_2$AlH; DMAH). In one embodiment, atomic layer deposition (ALD) of aluminum can be effected using trimethylaluminum (TMA) as a precursor gas and employing hydrogen plasma treatment. The hydrogen plasma can reduce the aluminum precursor gas, and improve the step coverage and surface morphology of the deposited aluminum film. The growth is self-limiting, and the film thickness of the deposited aluminum material is proportional of the number of cycles in the ALD process. The smooth surface of the deposited aluminum material can help minimize the size of cavities or seams in the middle of each backside recess 43 within the aluminum-containing material layer 46A. Optionally, an anneal process can be performed in a temperature range from 500 degrees Celsius to 600 degrees Celsius to stabilize the property of the aluminum-containing material layer 46A before performing a subsequent anneal at a higher temperature. A combination of a silicon-containing material and an aluminum-containing material is deposited within each of the backside recesses 43 by sequential deposition of the silicon-containing material layer 46S and the aluminum-containing material layer 46A. A backside cavity 79' is located within each backside trench 79.

Referring to FIG. 9E, portions of the aluminum-containing material and portions of the silicon-containing material are removed from inside the backside trenches 79 by an etch processes. For example, a first wet etch process can be performed to etch the aluminum-containing material of the aluminum-containing material layer 46A. The first wet etch process can employ a first etchant including a combination of at least two of hydrofluoric acid, hydrochloric acid, nitric acid, acetic acid, glycerin, hydrogen peroxide, and deionized water. The duration of the first wet etch process is selected such that the etch distance for the aluminum-containing material is sufficient to remove the aluminum-containing material from inside the backside trenches 79 without significantly removing the aluminum-containing material from inside the backside recesses 43. A second wet etch process can be performed to etch the silicon-containing material of the silicon-containing material layer 46S. The second wet etch process can employ a second etchant such as hot trimethyl-2 hydroxyethyl ammonium hydroxide ("hot TMY") and tetramethyl ammonium hydroxide (TMAH). The duration of the second wet etch process is selected such that the etch distance for the silicon-containing material is sufficient to remove the silicon-containing material from inside the backside trenches 79 without significantly removing the silicon-containing material from inside the backside recesses 43. Each remaining portion of the aluminum-containing material layer 46A can have a sidewall that is located at, or about, the vertical plane including the sidewalls of the insulating layers 32 around the respective backside trench 79. Each remaining portion of the silicon-containing material layer 46S can have a sidewall that is located at, or about, the vertical plane including the sidewalls of the insulating layers 32. The planar dielectric portions 616 at the bottom of the backside trenches 79 may be removed during etch back of the silicon-containing material layer 46S or during etch back of the aluminum-containing material layer 46A.

Referring to FIG. 9F, a first insulating spacer material layer 741L can be deposited in the backside trenches 79 and over the contact level dielectric layer 73. The first insulating spacer material layer 741L includes an insulating material such as silicon oxide or silicon nitride. The first insulating spacer material layer 741L can be deposited by a conformal deposition process such as a low pressure chemical vapor deposition (LPCVD) process. The thickness of the first insulating spacer material layer 741L can be in a range from 10 nm to 60 nm, such as from 20 nm to 40 nm, although lesser and greater thicknesses can also be employed.

Each aluminum-containing material layer 46A is entirely encapsulated by a combination of a silicon-containing material layer 46S and the first insulating spacer material layer 741L. In other words, all surfaces of the aluminum-containing material layers 46A are in physical contact with a respective one of the silicon-containing material layers 46S and the first insulating spacer material layer 741L.

Figure 9G:
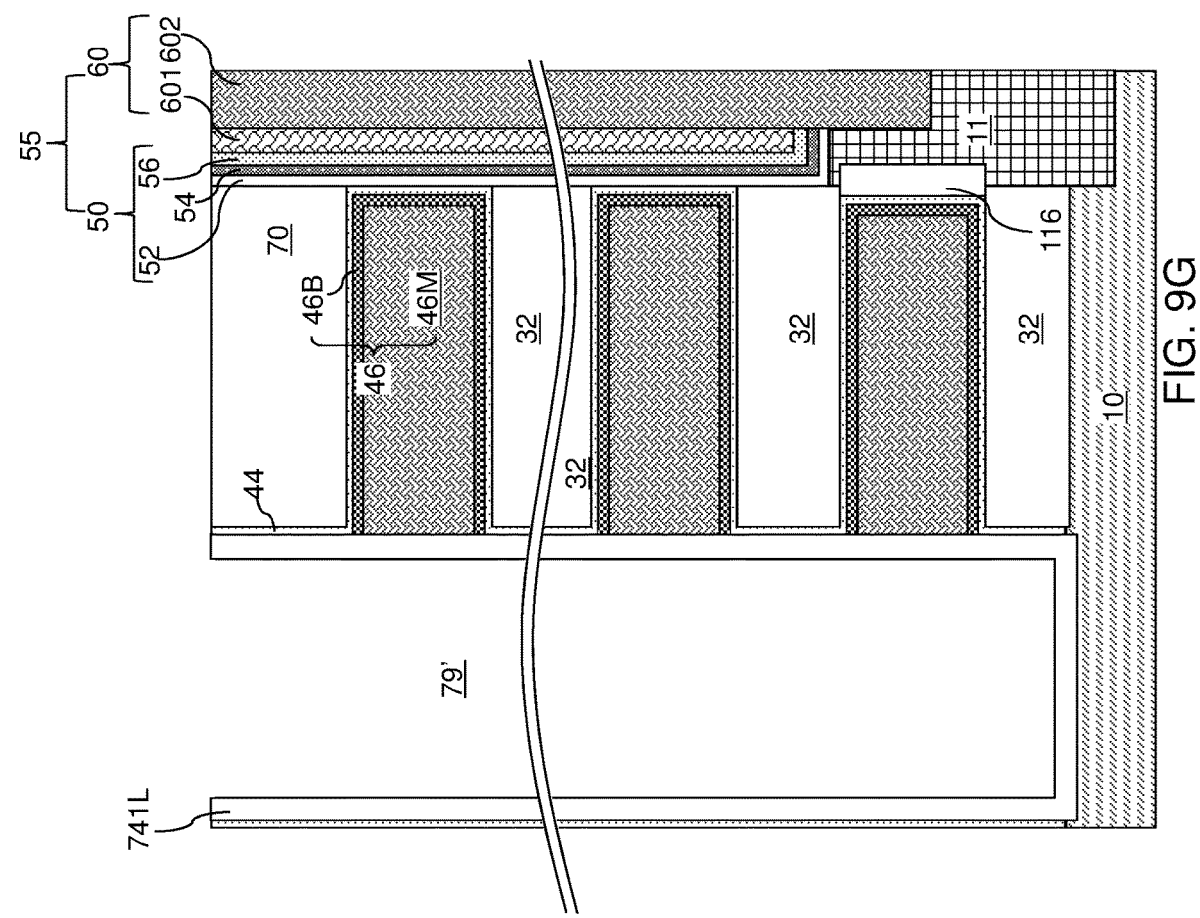

Referring to FIG. 9G, an anneal process is performed at an elevated temperature that is high enough to induce interdiffusion of silicon and aluminum within each contiguous pair of a silicon-containing material layer 46S and an aluminum-containing material layer 46A. Portions of the silicon-containing material and the aluminum-containing material within the backside recesses 43 interdiffuse to form metallic alloy material portion 46M, which include an alloy of aluminum and silicon. The temperature of the anneal process can be close to, or higher than, the aluminum-silicon eutectic temperature. The sacrificial material layers 42 are replaced with material portions including electrically conductive layers 46, each of which includes a contiguous set of a metallic barrier layer 46B and a metallic alloy material portion 46M. The electrically conductive layers 46 are formed at each level of the sacrificial material layers 42. Each of the electrically conductive layers 46 includes a respective metallic alloy material portion 46M including aluminum and silicon.

Figure 10A:
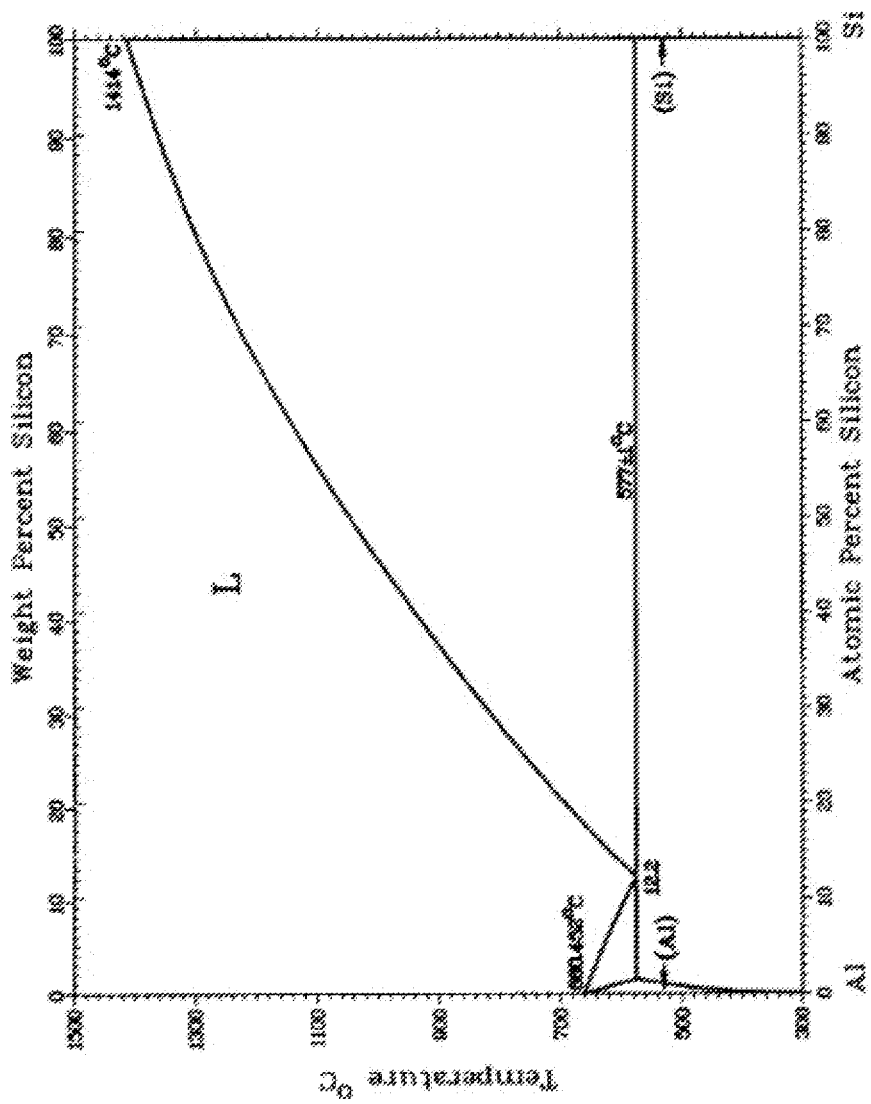
FIG. 10A is a phase diagram of an aluminum-silicon alloy system.

Referring to FIG. 10A, a phase diagram for the aluminum-silicon alloy system is shown. The eutectic temperature of this system is 577 degrees Celsius, and occurs at a silicon weight content of 11.7% which corresponds to atomic concentration of 12.2%. Formation of the aluminum-silicon alloy within the metallic alloy material portion 46M can be performed within a range of temperatures. For example, the temperature of the anneal process can be in a range from 550 degrees Celsius to 725 degrees Celsius, such as from 575 degrees Celsius to 700 degrees Celsius and/or from 600 degrees Celsius to 700 degrees Celsius and/or from 625 degrees Celsius to 675 degrees Celsius. In one embodiment, the temperature ramp rate during the anneal process can be in a range from 10 degrees per minute to 50 degrees per minute, such as from 20 degrees per minute to 40 degrees per minute. The duration of the anneal step at the elevated temperature (i.e., the anneal temperature) can be in a range from 10 seconds to 30 minutes. Generally, the higher the elevated temperature, the shorter the duration of the anneal step. After the anneal step, the temperature can be rapidly reduced at a ramp down rate of about 50 degrees per minute.

The dimensions of the backside recesses 43 and the thickness of the silicon-containing material layer 46S as formed at the processing steps of FIG. 9D can be selected such that at least 40%, such as at least 60% and/or at least 80%, of all atoms within the metallic alloy material portions 46M are aluminum atoms. Further, the dimensions of the backside recesses 43 and the thickness of the silicon-containing material layer 46S as formed at the processing steps of FIG. 9D can be selected such that at least 1% of all atoms, such as 3% of all atoms, and/or at least 5%, and/or at least 10%, within the metallic alloy material portions 46M are silicon atoms. In one embodiment, the metallic alloy material portions 46M contain 75 weight percent (wt. %) to 93 wt. % aluminum, such as from 85 wt. % to 90 wt. % aluminum, and greater than 5 wt. % silicon, such as 7 wt. % to 25 wt. % silicon, such as from 10 wt. % to 15 wt. %, including 12 wt. % to 15 wt. %, silicon. In one embodiment, the metallic alloy material portions 46M comprise a hypereutectic alloy of aluminum and silicon containing more than 11.7 wt % silicon, such as 12 wt. % to 15 wt. % silicon and remainder aluminum and unavoidable impurities to provide temperature stability and low resistivity.

Figure 10B:
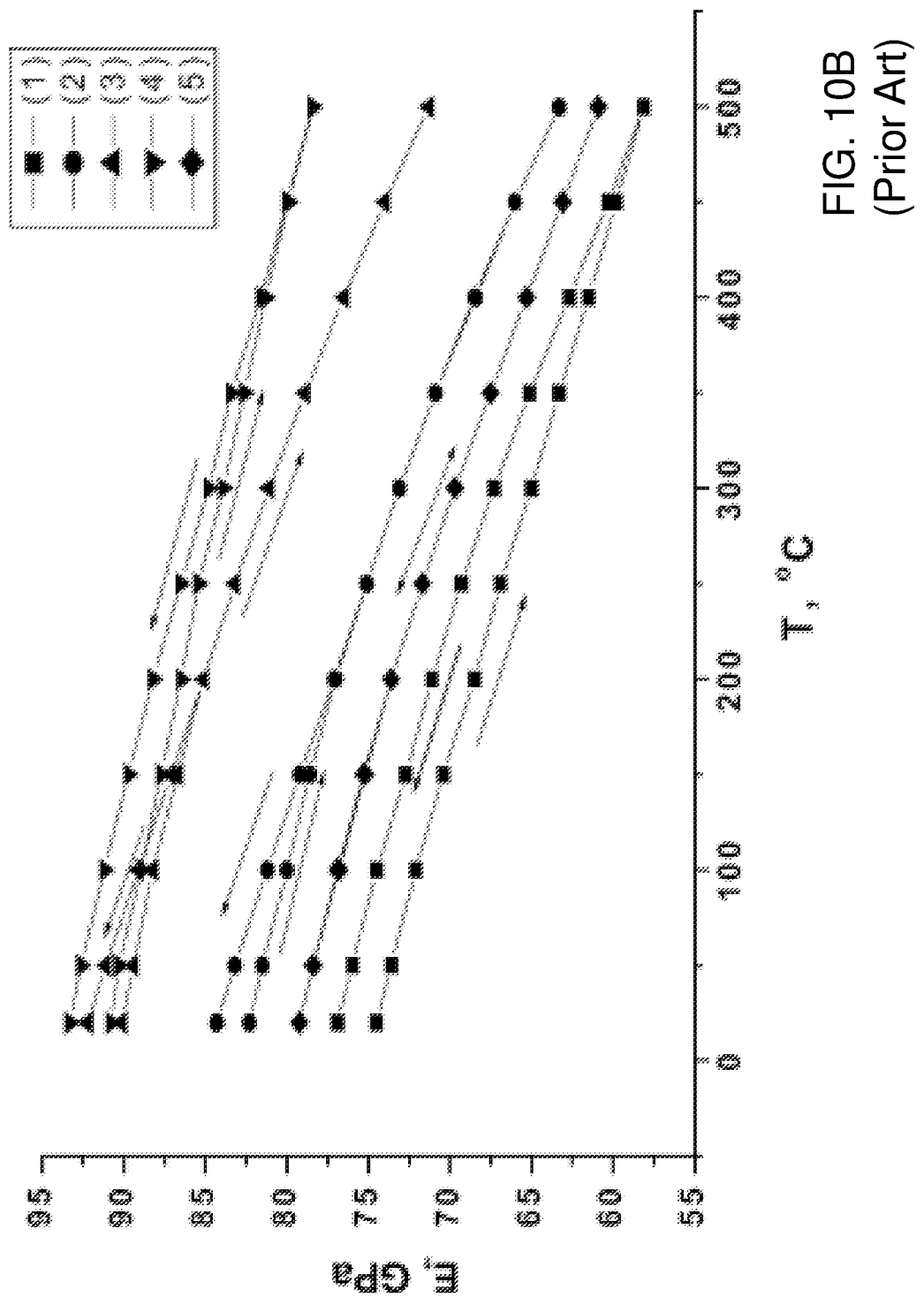
FIG. 10B is a graph illustrating stress reduction in Young's modulus of aluminum-silicon alloy as a function of temperature for various silicon contents.

According to an aspect of the present disclosure, the anneal process that forms the metallic alloy material portions 46M can reduce the mechanical stress generated by the materials in the backside recesses 43. Referring to FIG. 10B, data on the change of Young's modulus during an anneal of various silicon-aluminum alloy systems is illustrated. Data points labeled "1" correspond to samples consisting of 11.5% of silicon and 88.5% in aluminum in weight percentage, data points labeled "2" correspond to samples consisting of 20.0% silicon and 80.0% in aluminum in weight percentage, data points labeled "3" correspond to samples consisting of 30.0% of silicon and 70.0% of aluminum in weight percentage, data points labeled "4" correspond to samples consisting of 35.0% of silicon and 65.0% of aluminum in weight percentage, and data points labeled "5" correspond to samples consisting of 5.0% of silicon, 0.01% of strontium, and the balance of aluminum in weight percentage. About 8% reduction in Young's modulus occur after an anneal process at 500 degrees Celsius. Compared to tungsten metal lines, metal lines including an alloy of aluminum and silicon can provide a mechanical stress level that is in a range from 1/7 to 1/5 of the stress level generated by tungsten metal lines. Thus, the metallic alloy material portions 46M of the embodiments of the present disclosure can provide significantly less stress than conventional word lines composed primarily of tungsten.

Subsequent anneal processes preferably do not exceed the eutectic temperature of the aluminum-silicon system. As such, the metallic alloy material portions 46M of the present disclosure are compositionally and structurally stable during subsequent anneal processes.

Referring to FIG. 11A, a region of the first exemplary structure is illustrated during formation of an alternative embodiment of the first exemplary electrically conductive layers 46 according to the first embodiment of the present disclosure. The structure of FIG. 11A can be derived from the first exemplary structure illustrated in FIG. 9C by performing the processing steps of FIG. 9D within a modification to the composition of the aluminum-containing material layer 46A.

Specifically, a silicon-containing material layer 46S can be conformally deposited on the metallic barrier layer 46B in the same manner as in the processing steps of FIG. 9D. The composition and the thickness of the silicon-containing material layer 46S can be the same as in the processing steps of FIG. 9D.

An aluminum-containing material layer 46A' including an aluminum-containing material is conformally deposited on the silicon-containing material layer 46S by a conformal deposition process. In this embodiment, the aluminum-containing material layer 46A' comprises aluminum and at least another metal. The at least another metal can be a metal that reduces electromigration in aluminum. In one embodiment, the at least another metal can comprise copper. The conformal deposition process that deposits the aluminum-copper alloy material of the aluminum-containing material layer 46A' can comprise low pressure chemical vapor deposition (LPCVD) or atomic layer deposition (ALD). The duration of the conformal deposition process can be selected so that each remaining volume of the backside recesses 43 is filled with the aluminum-containing material layer 46A'.

The conformal deposition process can employ at least one aluminum precursor gas, which can be the same as the at least one aluminum precursor gas employed at the processing steps of FIG. 9D. Further, at least one copper precursor gas can be flowed into a processing chamber concurrently with, or alternately with, the at least one aluminum precursor gas. The at least one copper precursor gas can include, for example, cyclopentadienylcopper alkylphosphine ($\eta^5$-$C_5H_5CuP(C_2H_5)_3$; CpCuTEP). The at least one metallic element other than aluminum, such as copper, can be incorporated into the material of the aluminum-containing material layer 46A' in a range from 1 wt. % to 6 wt. %, such as from 2 wt. % to 6 wt. %, such as from 2 wt. % to 4 wt. %.

Optionally, an anneal process can be performed in a temperature range from 400 degrees Celsius to 500 degrees Celsius to stabilize the property of the aluminum-containing material layer 46A' before performing a subsequent anneal at a higher process. A combination of a silicon-containing material and an aluminum-containing material is deposited within each of the backside recesses 43 by sequential deposition of the silicon-containing material layer 46S and the aluminum-containing material layer 46A'. A backside cavity 79' is located within each backside trench 79.

Referring to FIG. 11B, the processing steps of FIG. 9E can be performed to remove portions of the aluminum-containing material and portions of the silicon-containing material from inside the backside trenches 79 employing an etch processes.

Referring to FIG. 11C, the processing steps of FIG. 9F can be performed to form a first insulating spacer material layer 741L in the backside trenches 79 and over the contact level dielectric layer 73. The first insulating spacer material layer 741L can have the same composition and thickness as in the processing steps of FIG. 9F. Each aluminum-containing material layer 46A' is entirely encapsulated by a combination of a silicon-containing material layer 46S and the first insulating spacer material layer 741L. In other words, all surfaces of the aluminum-containing material layer 46A' are in physical contact with one of the silicon-containing material layer 46S and the first insulating spacer material layer 741L.

Referring to FIG. 11D, the processing steps of FIG. 9G can be performed. Specifically, an anneal process is performed at an elevated temperature that is high enough to induce interdiffusion of silicon, aluminum, and the at least one additional metal (e.g., copper) within each contiguous pair of a silicon-containing material layer 46S and an aluminum-containing material layer 46A'. Portions of the silicon-containing material and the aluminum-containing material within the backside recesses 43 interdiffuse to form metallic alloy material portion 46M', which include an alloy of aluminum, silicon, and at least one additional metal, such as copper. The temperature of the anneal process can be close to, or higher than, the aluminum-silicon eutectic temperature. The sacrificial material layers 42 are replaced with material portions including electrically conductive layers 46, each of which includes a contiguous set of a metallic barrier layer 46B and a metallic alloy material portion 46M'. The electrically conductive layers 46 are formed at each level of the sacrificial material layers 42. Each of the electrically conductive layers 46 includes a respective metallic alloy material portion 46M' including aluminum, silicon, and at least one metal.

The dimensions of the backside recesses 43 and the thickness of the silicon-containing material layer 46S as formed at the processing steps of FIG. 9D can be selected such that at least 40%, such as at least 60% and/or at least 80%, of all atoms within the metallic alloy material portions 46M' are aluminum atoms. Further, the dimensions of the backside recesses 43 and the thickness of the silicon-containing material layer 46S as formed at the processing steps of FIG. 9D can be selected such that at least 1%, such as at least 3%, and/or at least 5%, and/or at least 10%, of all atoms within the metallic alloy material portions 46M' are silicon atoms. In this alternative embodiment, the metallic alloy material portions 46M' comprise, or consist essentially of, aluminum, silicon, and at least one additional metallic element other than aluminum. In one embodiment, the at least one additional metallic element can include copper.

In one embodiment, the metallic alloy material portions 46M' comprise an aluminum-silicon-copper alloy and contain 69 wt. % to 92 wt. % aluminum, such as from 79 wt. % to 89 wt. % aluminum, including 81 to 88, such as 81 to 86 wt. % aluminum. The alloy also contains greater than 1 wt. % silicon, such as greater than 5 wt. % silicon, such as 7 wt. % to 25 wt. % silicon, such as from 10 wt. % to 15 wt. %, including 12 wt. % to 15 wt. % silicon, and from 1 wt. % to 6 wt. %, including 2 wt. % to 4 wt. % copper.

The metallic alloy material portions (46M, 46M') of the first embodiment provide electrically conductive layers 46 having electrical resistivity on par with the electrical resistivity of aluminum, which is lower than the resistivity of tungsten by a factor in a range from 2 to 4 in bulk films. Considering that deposition of tungsten for use in electrically conductive layers typically involves deposition of a metallic seed layer having relatively high electrical resistivity, an aluminum-silicon alloy or an aluminum-silicon-metal alloy (such as an aluminum-silicon-copper alloy) formed in backside recesses 43 can provide electrical resistance that is in a range from ⅕ to ½ of the electrical resistance of an electrically conductive layer formed with a same geometry and containing tungsten. Thus, the various electrically conductive layers 46 of the present disclosure can provide lower electrical resistance compared to prior art electrically conductive layers composed primarily of tungsten.

The addition of the at least one metal element in the aluminum-silicon-metal alloy can improve electromigration resistance of the metallic alloy material portions 46M. The addition of the at least one metal element such as copper can enhance electromigration lifetime significantly, for example, by a factor of 10 or more. Thus, the electrically conductive layers 46 can be formed with enhanced reliability through addition of the at least one metal such as copper.

Referring to all drawings of, and according to various embodiments for, the first exemplary structure, a three-dimensional memory device is provided. The three-dimensional memory device comprises an alternating stack of insulating layers 32 and electrically conductive layers 46 located over a substrate; and memory stack structures 55 extending through the alternating stack (32, 46), wherein each of the memory stack 55 structures comprises a memory film 50 and a vertical semiconductor channel 60 contacting an inner sidewall of the memory film 50, and extends through each of the electrically conductive layers 46 and is laterally surrounded by each of the electrically conductive layers 46, wherein each of the electrically conductive layers includes a respective metallic alloy material portion 46M including aluminum and silicon. In one embodiment, at least 40%, such as least 60%, such as at least 80%, of all atoms within the metallic alloy material portions 46M are aluminum atoms. In one embodiment, at least 3%, such as at least 5%, such as at least 10%, of all atoms within the metallic alloy material portions are silicon atoms.

In one embodiment, each of electrically conductive layers 46 comprises a metallic barrier layer 46B embedding a respective metallic alloy material portion 46M and providing spatial separation of the metallic alloy material portion 46M from the insulating layers 32 and from the memory stack structures 55. A backside blocking dielectric layer 44 can be located between each neighboring pair of an insulating layer 32 and an electrically conductive layer 46 and between each memory stack structure 55 and each electrically conductive layer 46. In one embodiment, each metallic barrier layer 46B is spaced from the insulating layers 32 and the memory stack structures 55 by a respective portion of the backside blocking dielectric layer 44.

In the first embodiment, the metallic alloy material portion (46M, 46M') contains greater than 1 wt. % silicon, such as greater than 5 wt. % silicon. In one embodiment, the metallic alloy material portion contains from 75 wt. % to 93 wt. % aluminum and from 7 wt. % to 25 wt. % silicon, such as from 85 wt. % to 90 wt. % aluminum and from 10 wt. % to 15 wt. % silicon. In one embodiment, the metallic alloy material portion 46M comprises a hypereutectic alloy of aluminum and silicon containing from 12 wt. % to 15 wt. % silicon and remainder aluminum and unavoidable impurities.

In an alternative embodiment, the metallic alloy material portion 46M' further comprises at least one additional metallic element other than aluminum, such as copper. In this embodiment, the metallic alloy material portion 46M' comprises an aluminum-silicon-copper alloy containing from 69 wt. % to 92 wt. % aluminum, from 7 wt. % to 25 wt. % silicon, and from 1 wt. % to 6 wt. % copper, such as from 81 wt. % to 88 wt. % aluminum, from 10 wt. % to 15 wt. % silicon, and from 2 wt. % to 4 wt. % copper.

In one embodiment, each of the memory films 50 comprises a stack of a tunneling dielectric 56, a charge storage layer 54, and a blocking dielectric 52, each of the insulating layers 32 in the alternating stack (32, 46) contacts portions of outer sidewalls of each of the memory stack structures 55, and each of the memory stack structures 55 is laterally encircled by each of the electrically conductive layers 46. In one embodiment, the three-dimensional memory device comprises a NAND memory device and the electrically conductive layers 46 comprise word lines of the NAND memory device.

Figure 12A:
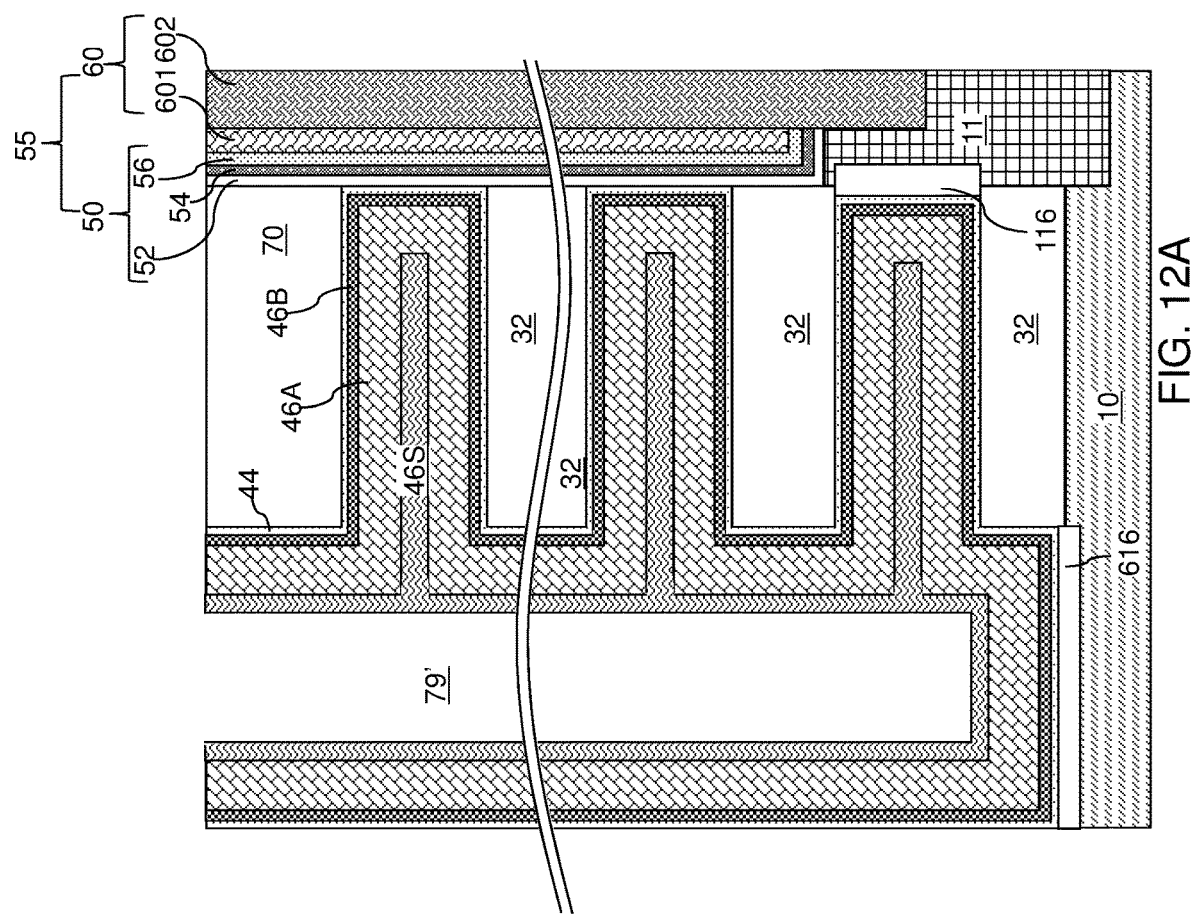
FIGS. 12A-12D are sequential vertical cross-sectional views of a region of a second exemplary structure during formation of second exemplary electrically conductive layers according to a second embodiment of the present disclosure.

In the second embodiment, the order of depositing the aluminum-containing material layer 46A, and the silicon-containing material layer 46S is reversed compared to the first embodiment. Referring to FIG. 12A, a region of a second exemplary structure according to the second embodiment of the present disclosure is illustrated after formation of backside recesses 43, a backside blocking dielectric layer 44, a metallic barrier layer 46B, an aluminum-containing material layer 46A, and a silicon-containing material layer 46S. The second exemplary structure of FIG. 12A can be derived from the first exemplary structure of FIG. 9C by sequential deposition of the aluminum-containing material layer 46A and the silicon-containing material layer 46S.

The aluminum-containing material layer 46A includes an aluminum-containing material. The aluminum-containing material layer 46A is conformally deposited at peripheral portions of the backside recesses 43 by a conformal deposition process. The aluminum-containing material layer 46A can consist essentially of aluminum or a combination of aluminum and at least another metal. In one embodiment, the aluminum-containing material layer 46A can consist essentially of aluminum. The conformal deposition process that deposits the aluminum-containing material of the aluminum-containing material layer 46A can comprise low pressure chemical vapor deposition (LPCVD) or atomic layer deposition (ALD). The duration of the conformal deposition process can be selected that an unfilled volume remains within each of the backside recesses 43 after deposition of the aluminum-containing material layer 46A.

The conformal deposition process can employ at least one aluminum precursor gas. The at least one aluminum precursor gas can be selected from trimethylaluminum ($Al(CH_3)_3$; TMA), dimethylaluminumchloride ($Al(CH_3)_2Cl$, and dimethylaluminum hydride ($(CH_3)_2AlH$; DMAH. In one embodiment, atomic layer deposition (ALD) of aluminum can be effected using trimethylaluminum (TMA) as a precursor gas and employing hydrogen plasma treatment. The hydrogen plasma can provide the function of reducing the at least one aluminum precursor gas for TMA, and improves the step coverage and surface morphology of the deposited aluminum film. The growth is self-limiting, and the film thickness of the deposited aluminum material is proportional of the number of cycles in the ALD process. The smooth surface of the deposited aluminum material can help minimize the size of cavities or seams in the middle of each backside recess 43 within the aluminum-containing material layer 46A. Optionally, an anneal process can be performed in a temperature range from 400 degrees Celsius to 500 degrees Celsius to stabilize the property of the aluminum-containing material layer 46A before performing a subsequent anneal at a higher temperature.

The percentage of the volume of the aluminum-containing material layer 46A within the backside recesses 43 relative to the total unfilled volume of the backside recesses after deposition of the metallic barrier layer 46B and prior to deposition of the aluminum-containing material layer 46A can be in a range from 25% to 95%, such as from 40% to 90% and/or from 60% to 85%, although lesser an greater percentages can also be employed.

The silicon-containing material layer 46S can be conformally deposited on the aluminum-containing material layer. The silicon-containing material layer 46S includes a silicon-containing semiconductor material. In one embodiment, the silicon-containing material layer 46S includes silicon and may optionally include one or more additional semiconductor material and/or p-type dopant atoms such as boron. In one embodiment, the silicon-containing material layer 46S can consist essentially of at least one semiconductor material including silicon and optional p-type dopant atoms. In one embodiment, the silicon-containing material layer 46S can consist essentially of undoped silicon, p-doped silicon, an undoped silicon-germanium alloy, a p-doped silicon-germanium alloy, an undoped silicon-germanium-carbon alloy, or a p-doped silicon-germanium-carbon alloy. In one embodiment the silicon, silicon-germanium or silicon-germanium-carbon can be n-type doped. In one embodiment, the silicon-containing material layer 46S can include an amorphous semiconductor material. In one embodiment, the silicon-containing material layer 46S can include amorphous silicon or an amorphous silicon-germanium alloy. The silicon-containing material layer 46S cab be deposited at peripheral portions of the backside recesses by a conformal deposition process such as low pressure chemical vapor deposition (LPCVD) or atomic layer deposition (ALD).

A combination of an aluminum-containing material and a silicon-containing material is deposited within each of the backside recesses 43 by sequential deposition of the aluminum-containing material layer 46A and the silicon-containing material layer 46S. A backside cavity 79 is located within each backside trench 79.

Figure 12B:
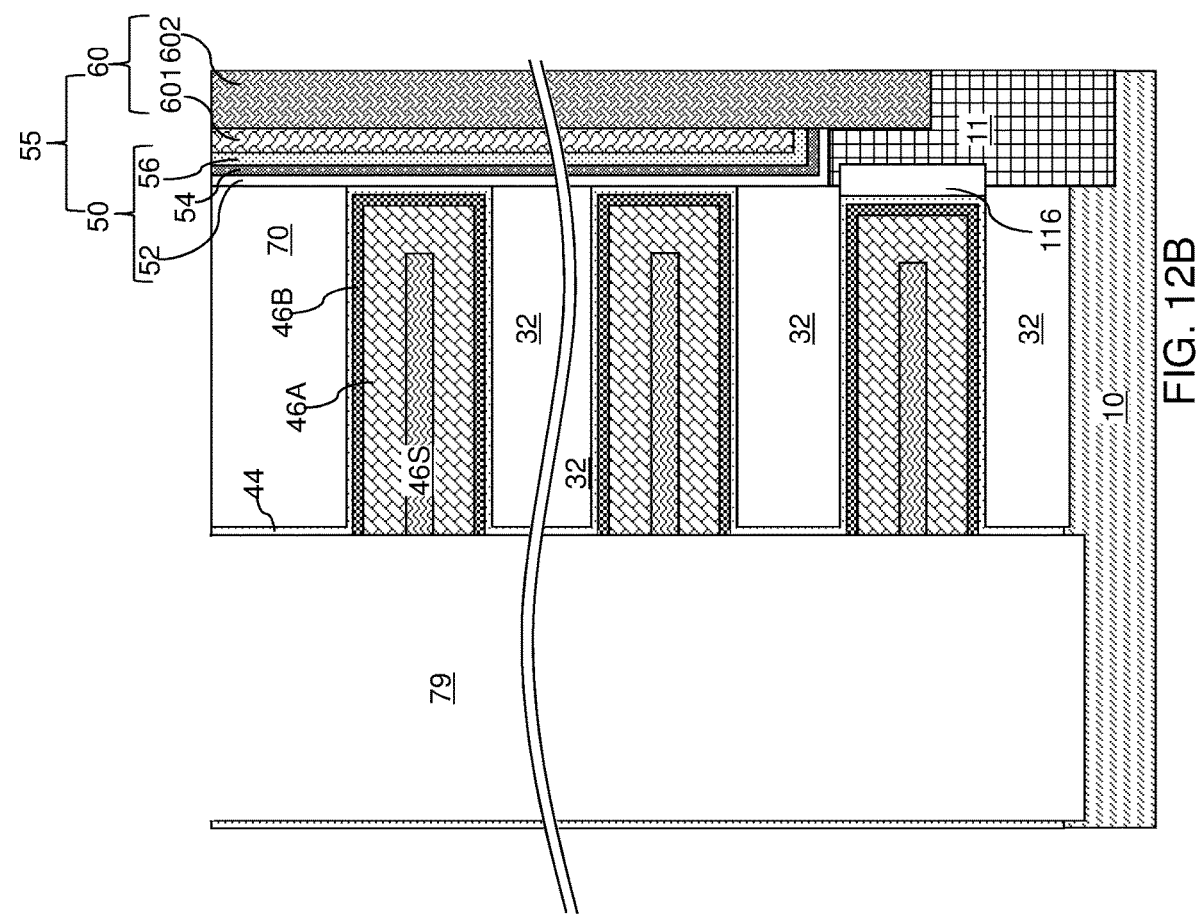

Referring to FIG. 12B, portions of the silicon-containing material and portions of the aluminum-containing material are removed from inside the backside trenches 79 by an etch process, such as the one described above with respect to FIG. 9B of the first embodiment.

Figure 12C:
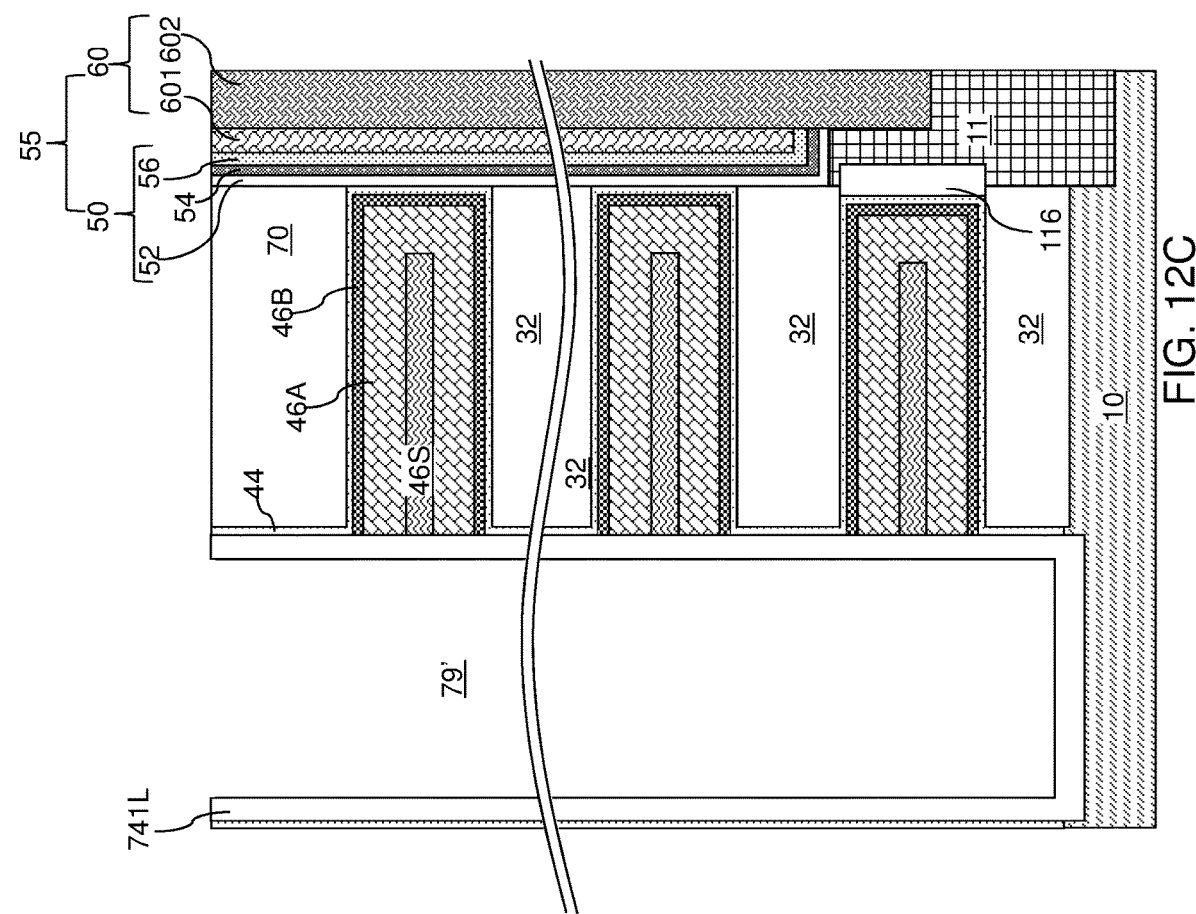

Referring to FIG. 12C, a first insulating spacer material layer 741L can be deposited in the backside trenches 79 and over the contact level dielectric layer 73. The first insulating spacer material layer 741L includes an insulating material such as silicon oxide or silicon nitride. The first insulating spacer material layer 741L can be deposited by a conformal deposition process such as a low pressure chemical vapor deposition (LPCVD) process. The thickness of the first insulating spacer material layer 741L can be in a range from 10 nm to 60 nm, such as from 20 nm to 40 nm, although lesser and greater thicknesses can also be employed.

Each silicon-containing material layer 46S is entirely encapsulated by a combination of an aluminum-containing material layer 46A and the first insulating spacer material layer 741L. In other words, all surfaces of the silicon-containing material layers 46S are in physical contact with a respective one of the aluminum-containing material layers 46A and the first insulating spacer material layer 741L.

Figure 12D:
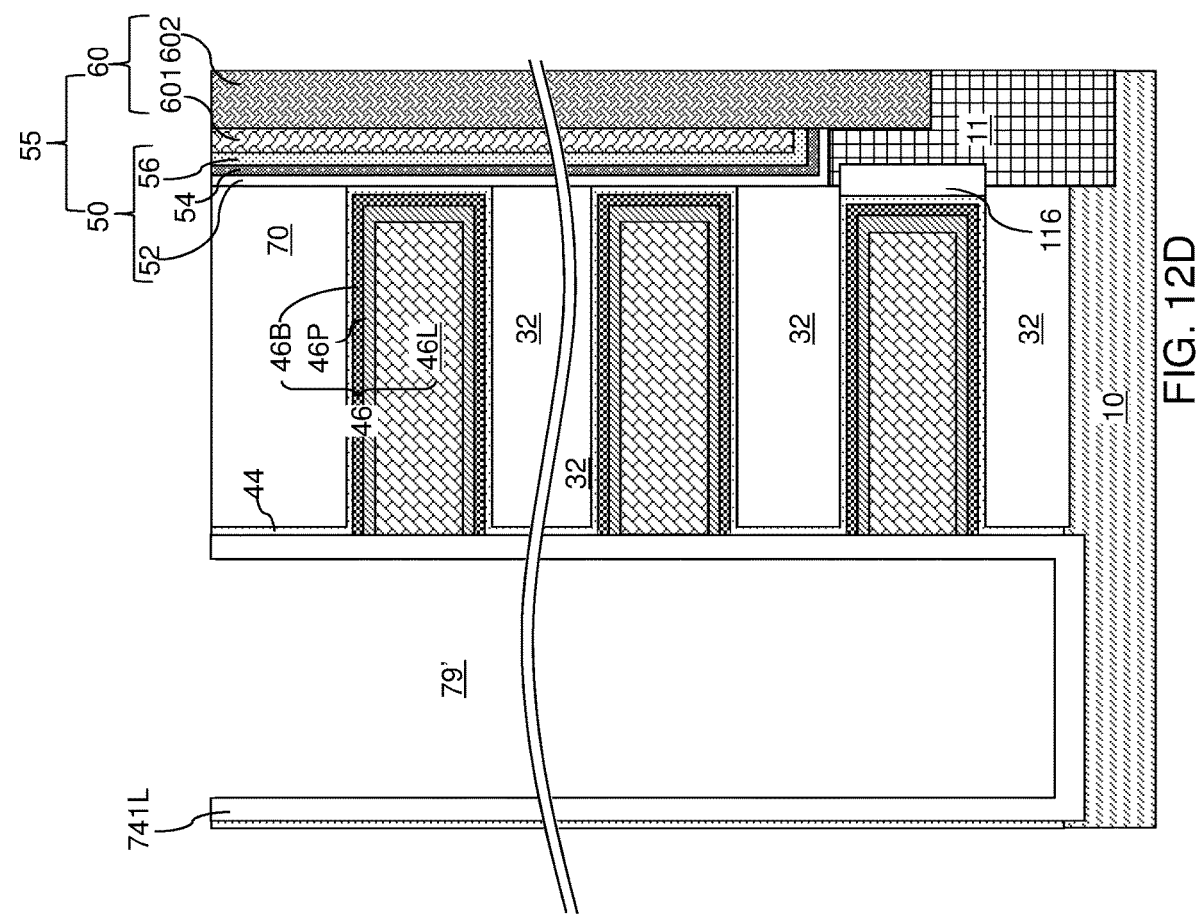

Referring to FIG. 12D, a thermal anneal is performed at an elevated temperature in a range from 550 degrees Celsius to 725 degrees Celsius, such as from 625 degrees Celsius to 700 degrees Celsius. In one embodiment, the temperature ramp rate during the anneal process can be in a range from 10 degrees per minute to 50 degrees per minute, such as from 20 degrees per minute to 40 degrees per minute. The duration of the anneal step at the elevated temperature (i.e., the anneal temperature) can be in a range from 10 seconds to 30 minutes.

A metal-induced crystallization (MIC), and specifically, an aluminum-induced crystallization (AIC) process can occur within the silicon-containing material layer 46S during the thermal anneal. During the aluminum-induced crystallization process, the silicon-containing material of the silicon-containing material layer 46S and the aluminum-containing material of the aluminum-containing material layer 46A exchange positions while the silicon-containing material becomes crystalline. In other words, the aluminum atoms in the aluminum-containing material layer 46A move toward the center of a volume encapsulated by a metallic barrier layer 46B and the first insulating spacer material layer 741L, and the silicon atoms in the silicon-containing material layer 46S move to the periphery of the volume encapsulated by the metallic barrier layer 46B and the first insulating spacer material layer 741L. An aluminum-containing portion 46L including, and/or consisting essentially of, aluminum is formed at the center region of each backside recess 43, and a silicon-containing portion 46P including aluminum-doped silicon is formed at the periphery of each backside recess 43.

The silicon-containing portions 46P can be formed on the surfaces of the metallic barrier layers 46B and optionally on the first insulating spacer material layer 741L during the anneal process. The silicon-containing portions 46P include an aluminum-doped silicon-containing semiconductor material, which can include, for example, aluminum-doped polysilicon, an aluminum-doped silicon-germanium alloy, or an aluminum-doped silicon-carbon alloy. The aluminum doping in the silicon-containing portions 46P increases the conductivity of the silicon-containing portions. Optionally, the silicon-containing material layer 46S can be doped with additional p-type dopants such as boron, and the silicon-containing portions 46P can be doped with aluminum and boron. In this case, boron can be introduced into the silicon-containing material layer 46S by in situ doping during deposition of the silicon-containing material layer 46S. The silicon-containing portions 46P can be formed with a large average grain size during the aluminum-assisted crystallization process to provide high conductivity.

Each contiguous set of a metallic barrier layer 46B, a silicon-containing portion 46P, and an aluminum-containing portion 46L constitutes an electrically conductive layer 46. The electrically conductive layers 46 are formed at each level of the sacrificial material layers 42. Each aluminum-containing portion 46L is encapsulated by a combination of a silicon-containing portion 46P and the first insulating spacer material layer 741L. Therefore, each surface of the aluminum-containing portions 46L contacts a respective one of the silicon-containing portions 46P or the first insulating spacer material layer 741L. Generally, the portions of the silicon-containing material and the aluminum-containing material within the backside recesses 43 are annealed at a temperature at which locations of the portions of the silicon-containing material and the aluminum-containing material within each backside recess 43 are inverted such that the aluminum-containing portion 46L of each electrically conductive layer 46 is embedded within the silicon-containing portion 46P of the electrically conductive layer 46 at the processing steps of FIG. 12D.

In the second embodiment, the sacrificial material layers 43 are replaced with material portions including electrically conductive layers 46. The electrically conductive layers 46 are formed at each level of the sacrificial material layers 42. Each of the electrically conductive layers 46 comprises a respective conductive fill material structure (46B, 46P, 46L) including an aluminum-containing portion 46L, a silicon-containing portion 46P, and optionally a metallic barrier layer 46B. In one embodiment, at least 85%, such as at least 90%, and/or at least 95%, of all atoms within the aluminum-containing portions 46L comprise aluminum atoms. In one embodiment, more than 99% of all atoms in the aluminum-containing portions 46L comprise aluminum atoms.

In one embodiment, the anneal temperature exceeds the eutectic temperature of the aluminum-silicon system, and the aluminum-containing portions 46L can include an aluminum-silicon alloy. In this case, the aluminum-containing portions 46L include silicon in range from 12 wt. % to 15 wt. %. Alternatively, the anneal temperature can be lower than the eutectic temperature of the aluminum-silicon alloy. In this case, the atomic concentration of aluminum atoms in the aluminum-containing portions 46L can be in a range from 85 wt. % to 99.9 wt. %, such as from 90 wt. % to 99 wt. % and/or from 95 wt. % to 98 wt. %.

At least 95%, such as at least 97%, and/or at least 99%, of all atoms within the silicon-containing portions 46P comprise silicon atoms. The silicon-containing portions 46P can include aluminum atoms as dopants, and may include an additional p-type dopant such as boron. In one embodiment, the silicon-containing portions 46P can include aluminum-doped polysilicon or a polycrystalline aluminum-doped silicon-germanium alloy.

According to an aspect of the present disclosure, the anneal process that forms the electrically conductive layers 46 can reduce the mechanical stress generated by the materials in the backside recesses 43. Compared to tungsten metal lines, metal lines including aluminum can provide a mechanical stress level that is in a range from $1/7$ to $1/5$ of the stress level generated by tungsten metal lines. Thus, the electrically conductive layers 46 of the second embodiment of the present disclosure can provide significantly less stress than conventional word lines composed primarily of tungsten.

Subsequent anneal processes preferably do not exceed the eutectic temperature of the aluminum-silicon system. As such, the electrically conductive layers 46 of the second embodiment of the present disclosure are compositionally and structurally stable during subsequent anneal processes.

Figure 13A:
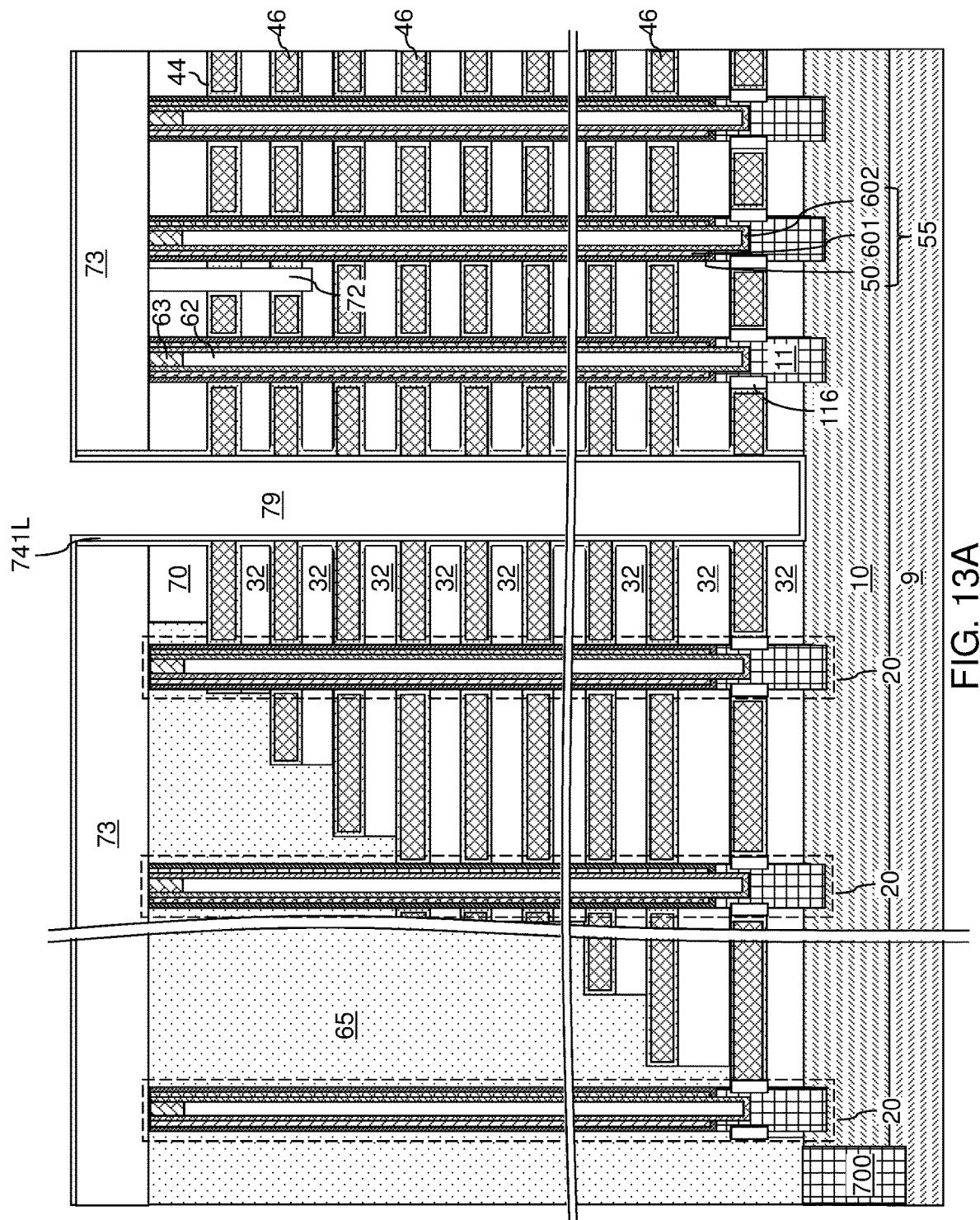
FIG. 13A is a schematic vertical cross-sectional view of the first or second exemplary structure after formation of an insulating spacer layer according to an embodiment of the present disclosure.
Figure 13B:
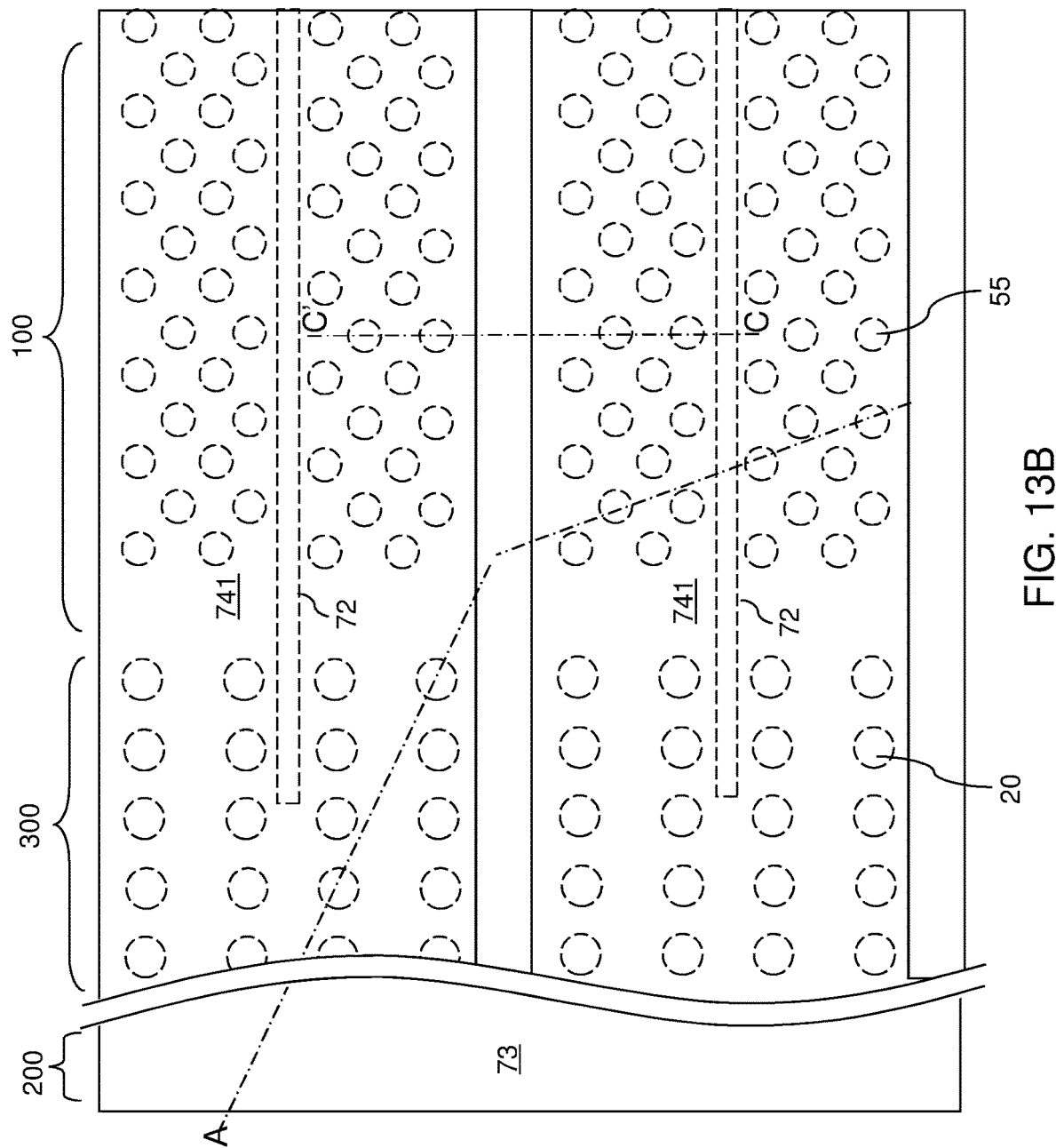
FIG. 13B is a magnified view of a region of the first or second exemplary structure of FIG. 13A.
Figure 13C:
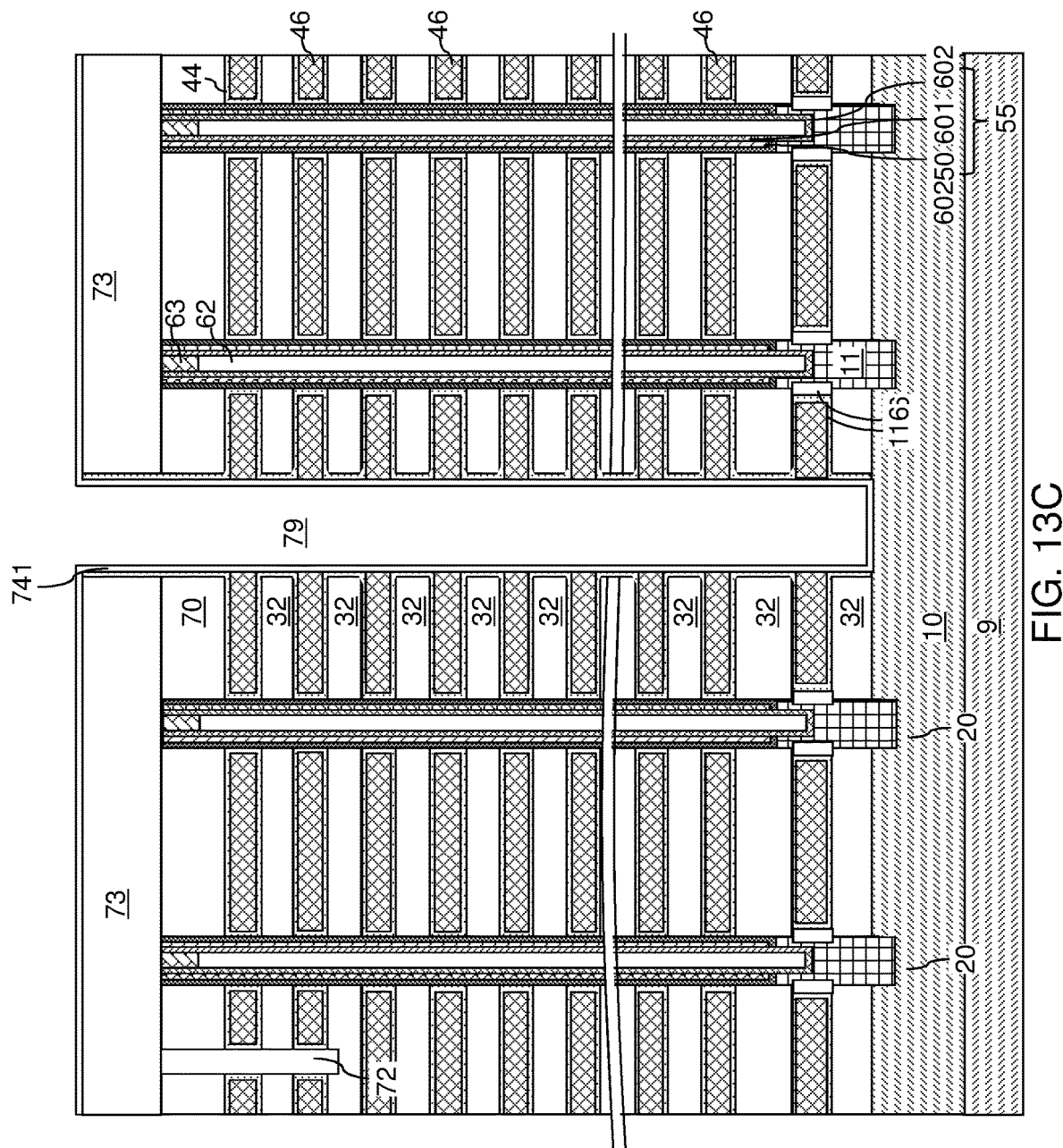
FIG. 13C is a schematic vertical cross-sectional view of the first or second exemplary structure along the vertical plane C-C' of FIG. 13B.

Referring to FIGS. 13A-13C, various views of the first or second exemplary structure are shown at the processing steps of FIG. 9G, FIG. 11D, or FIG. 12D. Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. A backside cavity 79' is present within each backside trench 79.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 14:
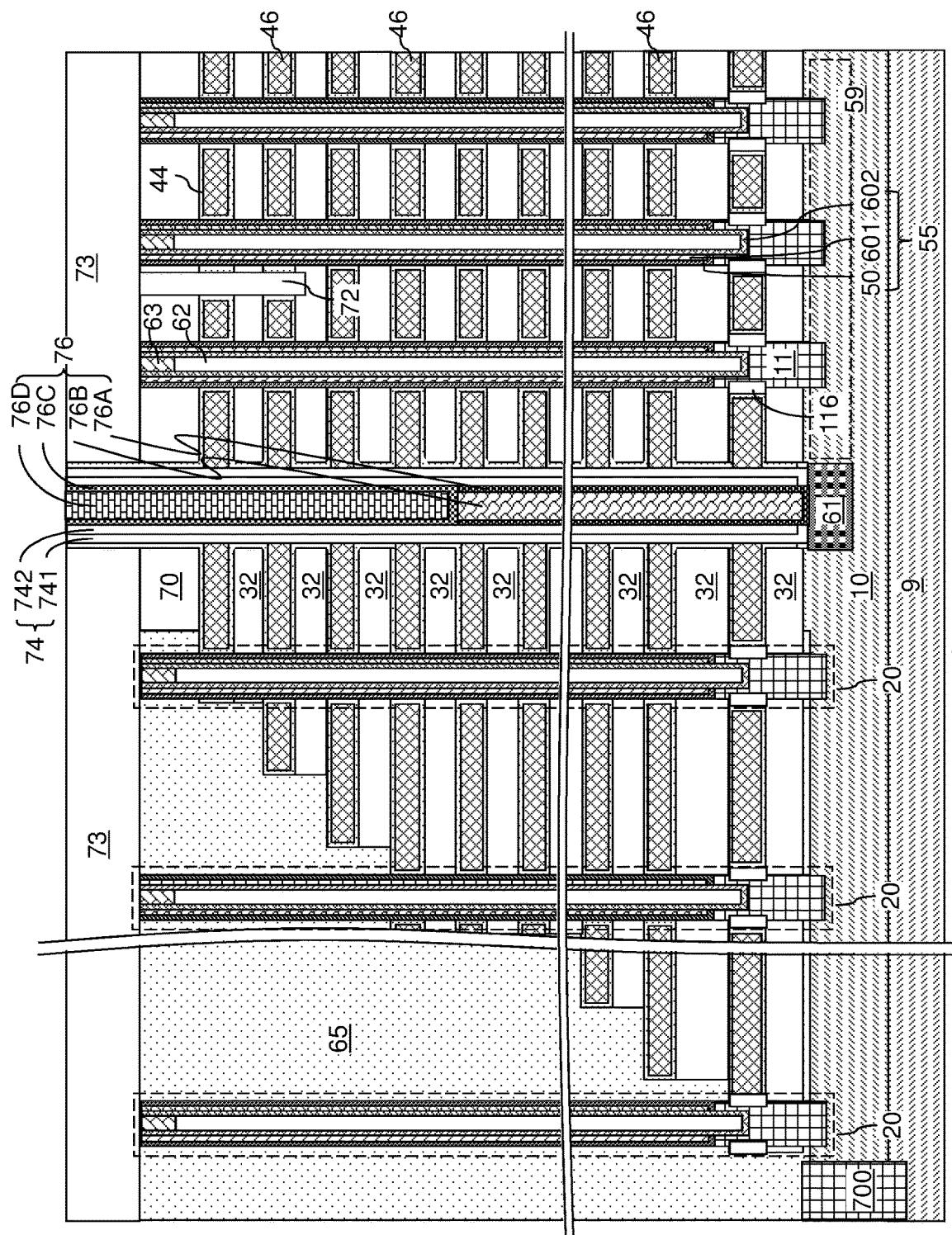
FIG. 14 is a schematic vertical cross-sectional view of the first or second exemplary structure after formation of a backside contact via structure within each backside trench according to an embodiment of the present disclosure.

Referring to FIG. 14, a second insulating spacer material layer can be optionally formed over the second insulating spacer material layer 741L and the contact level dielectric layer 73 by a conformal deposition process. Exemplary conformal deposition processes include, but are not limited to, chemical vapor deposition and atomic layer deposition. The second insulating spacer material layer includes an insulating material such as silicon oxide, silicon nitride, a dielectric metal oxide, an organosilicate glass, or a combination thereof. In one embodiment, the second insulating spacer material layer can include silicon oxide. The second insulating spacer material layer can be formed, for example, by low pressure chemical vapor deposition (LPCVD) or atomic layer deposition (ALD). The thickness of the second insulating spacer material layer can be in a range from 1.5 nm to 60 nm, although lesser and greater thicknesses can also be employed.

An anisotropic etch is performed to remove horizontal portions of the second insulating spacer material layer and the first insulating spacer material layer 741L from above the contact level dielectric layer 73 and at the bottom of each backside trench 79. Each remaining vertical portion of the first insulating spacer material layer 741L constitutes a first insulating spacer 741. Each remaining portion of the second insulating spacer material layer constitutes a second insulating spacer 742. A contiguous set of a first insulating spacer 741 and a second insulating spacer 742 is herein referred to as an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a first conductive liner 76A, a first conductive fill material portion 76B, a second conductive liner 76C, and a second conductive fill material portion 76D. The first conductive liner 76A can include a conductive metallic liner such as TiN, TaN, WN, TiC, TaC, WC, an alloy thereof, or a stack thereof. The thickness of the first conductive liner 76A can be in a range from 3 nm to 30 nm, although lesser and greater thicknesses can also be employed. The first conductive fill material portion 76B can include a heavily doped semiconductor material such as conductive polysilicon. The first conductive liner 76A and the first conductive fill material portion 76B can be deposited in the backside trenches 79 and subsequently recessed to a height that is in a range from 10% to 60%, such as from 20% to 40%, of the height of the backside trenches 79. Use of a doped semiconductor material as a conductive material at the bottom portion of each backside trench 79 can provide the benefit of reducing the stress generated by the conductive material in the backside trenches 79. The second conductive liner 76C and the second conductive fill material portion 76D can be subsequently deposited in the backside trenches 79. The second conductive liner 76C can include a conductive metallic liner such as TiN, TaN, WN, TiC, TaC, WC, an alloy thereof, or a stack thereof. The thickness of the second conductive liner 76C can be in a range from 3 nm to 30 nm, although lesser and greater thicknesses can also be employed. The second conductive fill material portion 76D can include a metal or a metallic alloy. For example, the second conductive fill material portion 76D can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 15A:
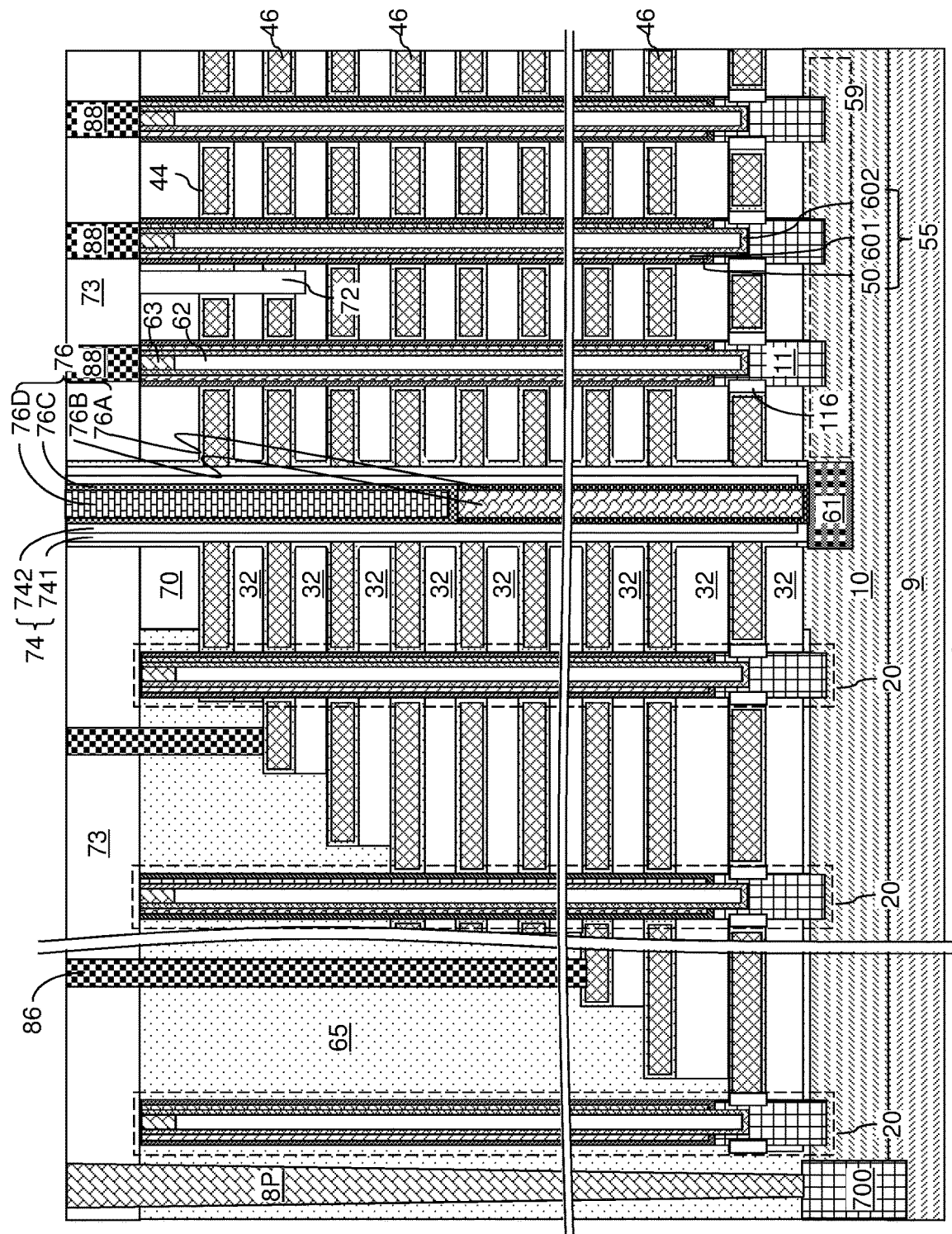
FIG. 15A is a schematic vertical cross-sectional view of the first or second exemplary structure after formation of additional contact via structures according to an embodiment of the present disclosure.
Figure 15B:
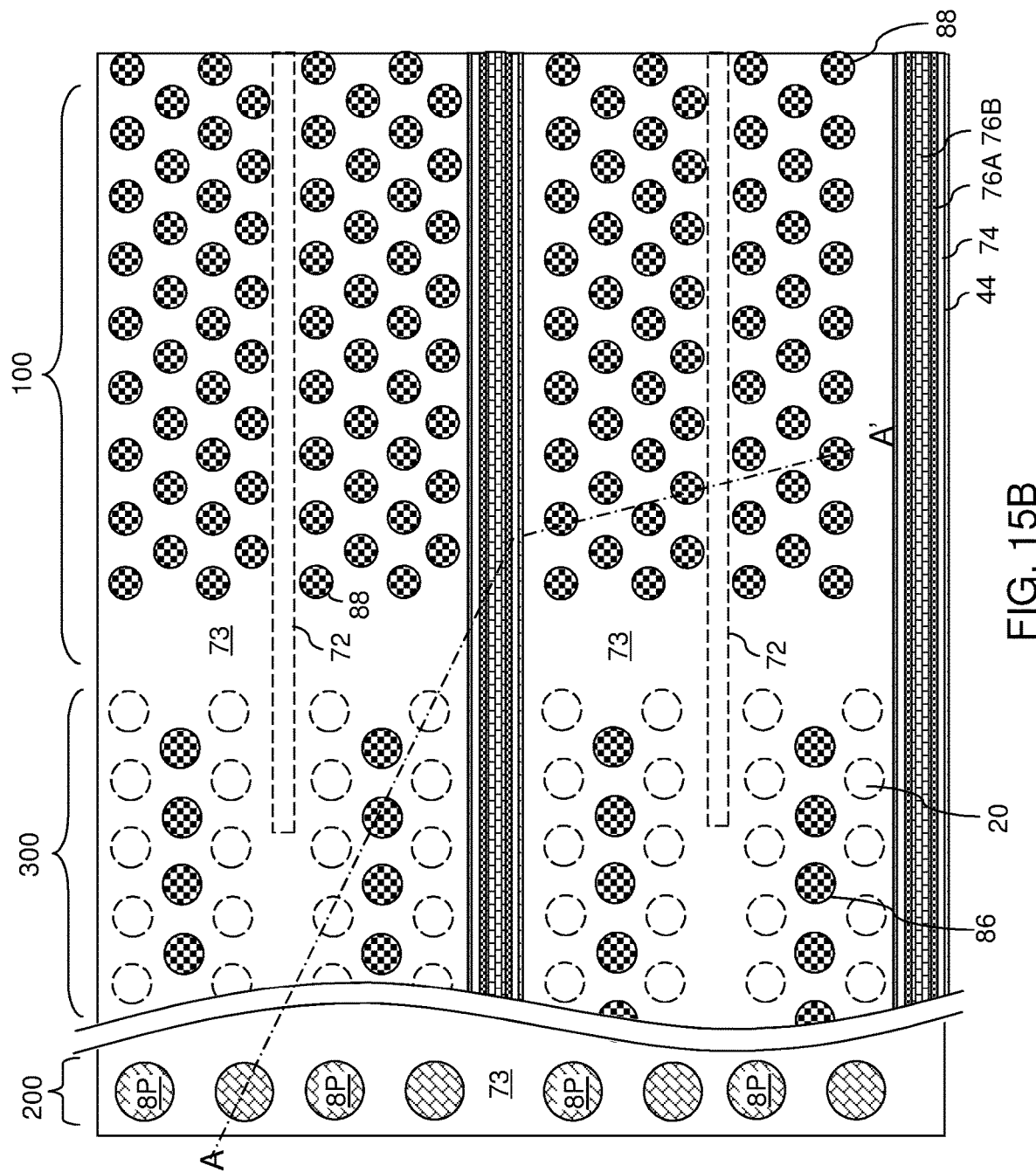
FIG. 15B is a top-down view of the first or second exemplary structure of FIG. 15A. The vertical plane A-A' is the plane of the schematic vertical cross-sectional view of FIG. 15A.

Referring to FIGS. 15A and 15B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings of, and according to various embodiments for, the second exemplary structure, a three-dimensional memory device is provided. The three-dimensional memory device comprises an alternating stack of insulating layers 32 and electrically conductive layers 46 located over a substrate; memory stack structures 55 extending through the alternating stack (32, 46), wherein each of the memory stack structures 55 comprises a memory film 50 and a vertical semiconductor channel 60 contacting an inner sidewall of the memory film 50, and extends through each of the electrically conductive layers 46 and is laterally surrounded by each of the electrically conductive layers 46, wherein each of the electrically conductive layers 46 comprises a respective conductive fill material structure including an aluminum-containing portion 46L surrounded on at least three sides by a silicon-containing portion 46P.

In one embodiment, at least 85% of all atoms within the aluminum-containing portions 46L comprise aluminum atoms. The atomic percentage of aluminum in the aluminum-containing portions 46L can be in a range from 85% to 88%, from 88% to 90%, from 90% to 92%, from 92% to 94%, from 94% to 96%, from 96% to 98%, from 98% to 99%, or from 99% to 99.9%. In one embodiment, at least 95% of all atoms (which may be at least 97% and/or at least 99%) within the silicon-containing portions 46P comprise silicon atoms.

In one embodiment, each of electrically conductive layers 46 further comprises a metallic barrier layer 46B embedding the conductive fill material structure (46L, 46P). In one embodiment, the metallic barrier layer 46B provides spatial separation of the conductive fill material structure (46L, 46P) from the insulating layers 32 and from the memory stack structures 55. In one embodiment, the aluminum-containing portion 46L of each electrically conductive layer 46 is spaced from the metallic barrier layer 46B of the electrically conductive layer 46 by the silicon-containing portion 46P of the electrically conductive layer 46.

In one embodiment, a backside blocking dielectric layer 44 can be located between each neighboring pair of an insulating layer 32 and an electrically conductive layer 46 and between each memory stack structure 55 and each electrically conductive layer 46.

In one embodiment, metallic barrier layer 46B is spaced from the insulating layers 32 and the memory stack structures 55 by a respective portion of the backside blocking dielectric layer 44. In one embodiment, the silicon-containing portion 46P of each electrically conductive layer 46 comprises polycrystalline silicon doped with aluminum.

In one embodiment, each of the memory films 50 comprises a stack of a tunneling dielectric 56, a charge storage layer 54, and a blocking dielectric 52; each of the insulating layers 32 in the alternating stack (32, 46) contacts portions of outer sidewalls of each of the memory stack structures 55; and each of the memory stack structures 55 is laterally encircled by each of the electrically conductive layers 46.

Referring to all drawings and all embodiments of the present disclosure, each three-dimensional memory device of the present disclosure can comprise a continuous insulating structure (such as an insulating spacer 74) laterally extending along a horizontal direction and vertically extending through each layer within the alternating stack (32, 46), wherein the metallic barrier layers 46B contact the continuous insulating structure 74. In the first embodiment, metallic alloy material portions 46M contact the continuous insulating structure 74. In the second embodiment, the metallic barrier layers 46B and the silicon-containing portions 46P contact the continuous insulating structure 74.

In one embodiment the three-dimensional memory device comprises a NAND memory device and the electrically conductive layers 46 comprise word lines of the NAND memory device. In one embodiment, each of the electrically conductive layers 46 is spaced from the insulating layers 32 and the memory stack structures 55 by a respective portion of a backside blocking dielectric layer 44; the alternating stack (32, 46) comprises a terrace region in which each electrically conductive layer 46 other than a topmost electrically conductive layer within the alternating stack (32, 46) laterally extends farther than any overlying electrically conductive layer 46 within the alternating stack (32, 46); the terrace region includes stepped surfaces of the alternating stack (32, 46) that continuously extend from a bottommost layer within the alternating stack (32, 46) to a topmost layer within the alternating stack (32, 46); and support pillar structures 20 extend through the stepped surfaces and through a retro-stepped dielectric material portion 65 that overlies the stepped surfaces.

In one embodiment, the three-dimensional memory devices of the exemplary structures can comprise a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

The various embodiments of the present disclosure provide aluminum-based electrically conductive layers 46 having low electrical resistance (high conductivity), low mechanical stress, and thermal stability against subsequent thermal cycling employed during manufacturing processes. The aluminum-based electrically conductive layers 46 can be employed as word lines for a three-dimensional memory device. The aluminum-based electrically conductive layers 46 of the embodiments of the present disclosure can provide technological solutions for the problem of high word line resistance and structural warpage in three-dimensional memory devices, as well as reduction of RC delay and enhancement of operational speed of the device. The aluminum-based electrically conductive layers 46 can include aluminum doped with silicon, an aluminum-silicon alloy, and/or an aluminum-silicon-copper alloy.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate; and
memory stack structures extending through the alternating stack, wherein each of the memory stack structures comprises a memory film and a vertical semiconductor channel contacting an inner sidewall of the memory film, and extends through each of the electrically conductive layers and is laterally surrounded by each of the electrically conductive layers,
wherein each of the electrically conductive layers comprises a respective conductive fill material structure including an aluminum-containing portion surrounded on at least three sides by a silicon-containing portion;
wherein each of electrically conductive layers further comprises a metallic barrier layer embedding the conductive fill material structure; and
wherein the metallic barrier layer provides spatial separation of the conductive fill material structure from the insulating layers and from the memory stack structures, wherein the metallic barrier layer is a separate layer from the silicon-containing portion, and the metallic barrier layer consists essentially of a metallic nitrade or a metallic carbide material.

2. The three-dimensional memory device of claim 1, wherein at least 85% of all atoms within the aluminum-containing portions comprise aluminum atoms.

3. The three-dimensional memory device of claim 1, wherein at least 95% of all atoms within the silicon-containing portions comprise silicon atoms.

4. The three-dimensional memory device of claim 1, further comprising a continuous dielectric material structure laterally extending along a horizontal direction and vertically extending through each layer within the alternating stack, wherein the metallic barrier layers and the silicon-containing portions contact the continuous insulating structure.

5. The three-dimensional memory device of claim 1, wherein the aluminum-containing portion of each electrically conductive layer is spaced from the metallic barrier layer of the electrically conductive layer by the silicon-containing portion of the electrically conductive layer.

6. The three-dimensional memory device of claim 1, further comprising a backside blocking dielectric layer located between each neighboring pair of an insulating layer and an electrically conductive layer and between each memory stack structure and each electrically conductive layer.

7. The three-dimensional memory device of claim 6, wherein each metallic barrier layer is spaced from the insulating layers and the memory stack structures by a respective portion of the backside blocking dielectric layer.

8. The three-dimensional memory device of claim 1, wherein the silicon-containing portion of each electrically conductive layer comprises polycrystalline silicon doped with aluminum.

9. The three-dimensional memory device of claim 1, wherein:
the three-dimensional memory device comprises a NAND memory device;
the electrically conductive layers comprise word lines of the NAND memory device;
each of the memory films comprises a stack of a tunneling dielectric, a charge storage layer, and a blocking dielectric;
each of the insulating layers in the alternating stack contacts portions of outer sidewalls of each of the memory stack structures; and
each of the memory stack structures is laterally encircled by each of the electrically conductive layers.

10. The three-dimensional memory device of claim 9, wherein:
the alternating stack comprises a terrace region in which each electrically conductive layer other than a topmost electrically conductive layer within the alternating stack laterally extends farther than any overlying electrically conductive layer within the alternating stack;
the terrace region includes stepped surfaces of the alternating stack that continuously extend from a bottommost layer within the alternating stack to a topmost layer within the alternating stack;
a retro-stepped dielectric material portion overlies the terrace region; and
support pillar structures extend the retro-stepped material portion, the stepped surfaces, and portions of the alternating stack that underlie the stepped surfaces.

* * * * *